United States Patent
Tsuchimura

(10) Patent No.: US 7,306,894 B2
(45) Date of Patent: Dec. 11, 2007

(54) POLYMERIZABLE COMPOSITION, PHOTOPOLYMERIZING METHOD AND PROCESS FOR PRODUCING LITHOGRAPHIC PRINTING PLATE USING THE POLYMERIZABLE COMPOSITION

(75) Inventor: Tomotaka Tsuchimura, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/067,250

(22) Filed: Feb. 28, 2005

(65) Prior Publication Data

US 2005/0202341 A1  Sep. 15, 2005

(30) Foreign Application Priority Data

Feb. 26, 2004 (JP) ............................ P. 2004-051134
Mar. 23, 2004 (JP) ............................ P. 2004-084973

(51) Int. Cl.
*G03F 7/14* (2006.01)
*G03F 7/029* (2006.01)
*G03F 7/027* (2006.01)

(52) U.S. Cl. ................. 430/281.1; 430/286.1; 430/302

(58) Field of Classification Search ............ 430/270.1, 430/281.1, 286.1, 302, 309, 434, 435, 494
See application file for complete search history.

(56) References Cited

U.S. PATENT DOCUMENTS

| 4,268,610 A |   | 5/1981  | Roos |
|---|---|---|---|
| 4,680,249 A | * | 7/1987  | Weed ........................ 430/281.1 |
| 4,710,262 A | * | 12/1987 | Weed ........................... 430/323 |
| 4,962,011 A | * | 10/1990 | Aldag et al. .............. 430/281.1 |
| 5,102,775 A | * | 4/1992  | Okuhara et al. .......... 430/287.1 |
| 5,403,698 A | * | 4/1995  | Tachiki et al. ........... 430/286.1 |
| 5,663,212 A | * | 9/1997  | Wakata et al. ................. 522/75 |
| 6,423,471 B1 | * | 7/2002 | Sorori et al. ............. 430/281.1 |

FOREIGN PATENT DOCUMENTS

| EP | 0398713 A2 |   | 11/1990 |
|---|---|---|---|
| EP | 0501433 A1 |   | 9/1992 |
| EP | 1048982 A1 |   | 11/2000 |
| EP | 1262829 A1 |   | 12/2002 |
| EP | 1288720 A  |   | 3/2003 |
| JP | 11-160880  | * | 6/1999 |
| JP | 2002-139843 A |  | 5/2002 |
| JP | 2002-351065 A |  | 12/2002 |
| JP | 2003-035953 | * | 2/2003 |
| JP | 2003-43692 A |  | 2/2003 |
| JP | 2003-64130 A |  | 3/2003 |

* cited by examiner

*Primary Examiner*—Richard L. Schilling
(74) *Attorney, Agent, or Firm*—Sughrue Mion, PLLC

(57) ABSTRACT

A polymerizable composition comprising an ethylenic monomer, a photopolymerization initiator and a specific benzotriazole compound or sulfone compound, and a method for producing a lithographic printing plate comprising a step of exposing a light-sensitive layer containing the above-described polymerizable composition on a support with laser light having a wavelength of 450 nm or shorter and a step of treating the exposed light-sensitive layer with a developing solution having a pH of 13.0 or less.

4 Claims, No Drawings

POLYMERIZABLE COMPOSITION, PHOTOPOLYMERIZING METHOD AND PROCESS FOR PRODUCING LITHOGRAPHIC PRINTING PLATE USING THE POLYMERIZABLE COMPOSITION

FIELD OF THE INVENTION

The present invention relates to a polymerizable composition, for example, a photopolymerizable composition for an image-recording material (hereinafter also referred to as "photopolymerizable composition"), a photopolymerizing method and a process for producing a lithographic printing plate using the polymerizable composition and, in particular, to a polymerizable composition which shows a high sensitivity when applied to a scanning exposure type lithographic printing plate precursor adapted for CTP system excellent in handling properties and production cost and which shows an excellent storage stability, a photopolymerizing method and a process for producing a lithographic printing plate using the poloymerizable composition.

BACKGROUND OF THE INVENTION

Heretofore, a PS plate comprising a hydrophilic support having provided thereon an oleophilic photosensitive resin has been widely used as a lithographic printing plate precursor. As the usual plate-making method thereof, the plate printing plate precursor is subjected to mask exposure (flood exposure) through a lith film and then the non-image area is dissolved away to obtain a desired printing plate.

In recent years, digitization technology of electronically processing, storing and outputting an image information using a computer has been popularized. To cope with the digitization technology, various new methods for outputting an image have been proposed and are actually used. This tendency has yielded the demand for a computer-to-plate (CTP) technique where a printing plate can be directly produced by scanning a highly directional light such as laser light according to a digitized image information without using a lith film. As a result, it has become an important technical concern to obtain a printing plate precursor adapted for the CTP technique.

As a lithographic printing plate precursor which permits scan exposure, a constitution has been proposed wherein a photopolymerizable composition having an extremely excellent light-sensitive speed is used as the oleophilic light-sensitive resin layer formed on a hydrophilic support and an oxygen-impermeable protective layer is further provided thereon, and is available on the market. The printing plate precursor of the above-described constitution provides desirable printing plate properties and printing performance that it makes simple and easy the development processing and provides a printing plate excellent in resolving power, ink-receptive properties and printing durability.

On the other hand, recent years have seen a remarkable progress of laser technology. For example, a semiconductor laser which uses an InGaN-based material and can continuously oscillate in the range of from 360 nm to 450 nm, has come to be put into practice. A CPT system using such short-wavelength light source would make it possible to use a light-sensitive material having a light-sensitive region in the shorter wavelength region which permits to handle under a brighter safe light. Further, semiconductor lasers can be produced inexpensively due to the structure thereof, thus being extremely preferred as a light source for the CPT system.

It has been strongly desired in this industrial field to obtain a lithographic printing plate precursor adapted for the CTP system using the semiconductor laser emitting a light of comparatively short wavelength of from 350 nm to 450 nm.

In recent years, printing plate precursors containing a triazine-based initiation system (JP-A-14-116540) or a titanocene-based initiation system (JP-A-13-42524) in the photopolymerizable layer have been disclosed for the CTP system using the short-wavelength light source. The printing plate precursor having the triazine-based initiation system is highly sensitive and can be handled under a yellow light, but involves the problem that it has an insufficient storage stability (accelerated aging for a long time: for example, at 60° C. for 3 days).

Also, for the CTP system using an infrared laser of 800 nm in wavelength as a laser light source, lithographic printing plate precursors capable of being handled in a bright room (under a yellow lamp or a white lamp) is disclosed in, for example, patent document 1 (JP-A-2002-139843).

However, in the CTP system using the infrared laser as a light source, abrasion of the printing plate surface occurs due to the strong beam exposure, and residue formed by the abrasion has been a problem. Also, since a light-sensitive material for an infrared laser is much less sensitive in comparison with a light-sensitive material for a visible light laser, it involves a problem of poor productivity.

On the other hand, as light-sensitive lithographic printing plate materials for obtaining both an enough sensitivity and storage stability, there have been known those which use a specific sensitizing dye as disclosed in patent document 2 (JP-A-2002-351065), those which use a specific intermediate layer as disclosed in patent document 3 (JP-A-2003-43692), and those which use a specific cross-linking agent as disclosed in patent document 4 (JP-A-2003-64130).

[Patent document 1] JP-A-2002-139843
[Patent document 2] JP-A-2002-351065
[Patent document 3] JP-A-2003-43692
[Patent document 4] JP-A-2003-64130

SUMMARY OF THE INVENTION

Therefore, an object of the invention is to provide a polymerizable composition which, when applied to a lithographic printing plate for scanning exposure adapted for CTP system, does not suffer reduction in sensitivity and can reproduce halftone dot area with a high fidelity after, for example, accelerated aging and which has excellent handling properties, advantage with production cost, and storage stability, a photopolymerizing method and a process for producing a lithographic printing plate using the polymerizable composition.

As a result of intensive investigations, the inventor has found that the above-described problem can be solved by using a specific benzotriazole compound or sulfone compound in the polymerizable composition, thus having achieved the invention based on the finding.

The invention includes the followings:

(1) A polymerizable composition comprising an ethylenic monomer, a photopolymerization initiator and a benzotriazole compound represented by the following formula (I):

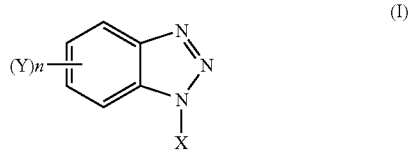

wherein X and Y each independently represents a monovalent substituent, and n represents an integer of from 1 to 4 provided that, when n represents 2 or more, Ys may be the same or different from each other, or may be combined with each other to form a ring structure.

(2) The polymerizable composition as described in (1), wherein the benzotriazole compound is a compound represented by the following formula (II) or (III):

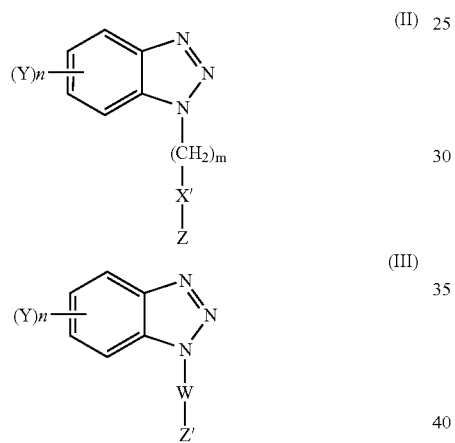

wherein X' represents O, S or NZ', Z, Z' and Y each independently represents a monovalent substituent, n represents an integer of from 1 to 4 provided that, when n represents 2 or more, Ys may be the same or different from each other, or may be combined with each other to form a ring structure, W represents —C(=O)— or —S(=O)$_2$—, and m represents an integer of from 0 to 3.

(3) A polymerizable composition comprising an ethylenic monomer, a photopolymerization initiator and a sulfone compound.

(4) The polymerizable composition as described in (3), wherein the sulfone compound is a compound represented by the following formula (IV):

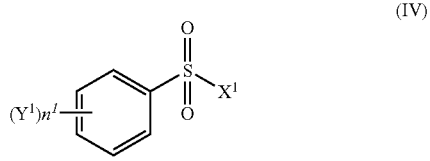

wherein $X^1$ and $Y^1$ each independently represents a monovalent substituent, $n^1$ represents an integer of from 1 to 5 and, when $n^1$ represents 2 or more, $Y^1$s may be the same or different from each other, or may be combined with each other to form a ring structure.

(5) The polymerizable composition as described in any one of (1) to (4), wherein the photopolymerization initiator comprises a titanocene compound.

(6) A lithographic printing plate precursor comprising a support and a light-sensitive layer containing the polymerizable composition described in any one of (1) to (5).

(7) A photopolymerizing method comprising exposing the polymerizable composition described in any one of (1) to (5) to a laser light having a wavelength of 450 nm or shorter.

(8) A process of producing a lithographic printing plate involving a step of exposing a lithographic printing plate precursor comprising a support provided thereon a light-sensitive layer to a laser light having a wavelength of 450 nm or shorter and a step of treating the exposed precursor with a developing solution, wherein the light-sensitive layer contains the polymerizable composition described in any one of (1) to (5) and the developing solution has a pH of 13.0 or less.

DETAILED DESCRIPTION OF THE INVENTION

Although it is not clear in detail how the benzotriazole compound or sulfone compound functions in the polymerizable composition of the invention, the compound incorporated in the composition presumably serves to effectively utilize a radical generated from the initiator and functions to convert the radical to a more active radical species or functions as a chain transfer agent, thus improving the efficiency of radical polymerization and increasing the sensitivity. Particularly large effects can be obtained by using a titanocene compound as the initiator. This may be attributed to that the compound coordinates with the titanocene compound to improve radical-generating efficiency, thus polymerization being accelerated.

Accordingly, the invention can provide a polymerizable composition which, when applied to a lithographic printing plate for scanning exposure adapted for CTP system, does not suffer reduction in sensitivity and can reproduce halftone dot area with a high fidelity after, for example, incubation and which has excellent handling properties, advantage with production cost and storage stability, a photopolymerizing method and a process for producing a lithographic printing plate using the polymerizable composition.

First, the benzotriazole compounds represented by formula (I) are described below.

Specific examples of the monovalent substituent represented by X or Y in formula (I) include a straight-chain, branched-chain or cyclic alkyl group containing from 1 to 20 carbon atoms, a straight-chain, branched-chain or cyclic alkenyl group containing from 2 to 20 carbon atoms, an alkynyl group containing from 2 to 20 carbon atoms, an aryl group containing from 6 to 20 carbon atoms, an acyloxy group containing from 1 to 20 carbon atoms, an alkoxycarbonyloxy group containing from 2 to 20 carbon atoms, an aryloxycarbonyloxy group containing from 7 to 20 carbon atoms, a carbamoyloxy group containing from 1 to 20 carbon atoms, a carbonamido group containing from 1 to 20 carbon atoms, a sulfonamido group containing from 1 to 20 carbon atoms, a carbamoyl group containing from 1 to 20 carbon atoms, a sulfamoyl group containing from 0 to 20 carbon atoms, an alkoxy group containing from 1 to 20 carbon atoms, an aryloxy group containing from 6 to 20 carbon atoms, an aryloxycarbonyl group containing from 7 to 20 carbon atoms, an alkoxycarbonyl group containing from 2 to 20 carbon atoms, an N-acylsulfamoyl group containing from 1 to 20 carbon atoms, an N-sulfamoylcarbamoyl group containing from 1 to 20 carbon atoms, an alkylsulfonyl group containing from 1 to 20 carbon atoms, an arylsulfonyl group containing from 6 to 20 carbon atoms, an alkoxycarbonylamino group containing from 2 to 20 carbon atoms, an aryloxycarbonylamino group containing from 7 to 20 carbon atoms, an amino group containing from 0 to 20 carbon atoms, an imino group containing from 1 to 20 carbon atoms, an ammonio group containing from 3 to 20 carbon atoms, a carboxyl group, a sulfo group, a mercapto garoup, an alkylsulfinyl group containing from 1 to 20 carbon atoms, an arylsulfinyl group containing from 6 to 20 carbon atoms, an alkylthio group containing from 1 to 20 carbon atoms, an arylthio group containing from 6 to 20 carbon atoms, a ureido group containing from 1 to 20 carbon atoms, a hetero ring group containing from 2 to 20 carbon atoms, an acyl group containing from 1 to 20 carbon atoms, a sulfamoylamino group containing from 0 to 20 carbon atoms, a silyl group containing from 2 to 20 carbon atoms, an isocyanato group, an isocyanido group, a halogen atom (e.g., a fluorine atom, a chlorine atom or a bromine atom), a cyano group, a nitro group, an onium group and a hydrogen atom. The substituents may further have a substituent. Also, when n represents 2 or more, Ys may be the same or different from each other or may be combined with each other to form a ring structure. Specific examples of the ring formed include an aliphatic ring (e.g., cycloalkane, cycloalkene or cycloalkyne), a spiro ring, a hetero ring and an aromatic ring.

The ring structure may further have a substituent. Examples of the substituent include those which have been illustrated as specific examples of X or Y.

Specific examples of the compound represented by formula (I) used in the invention are illustrated below which, however, do not limit the invention.

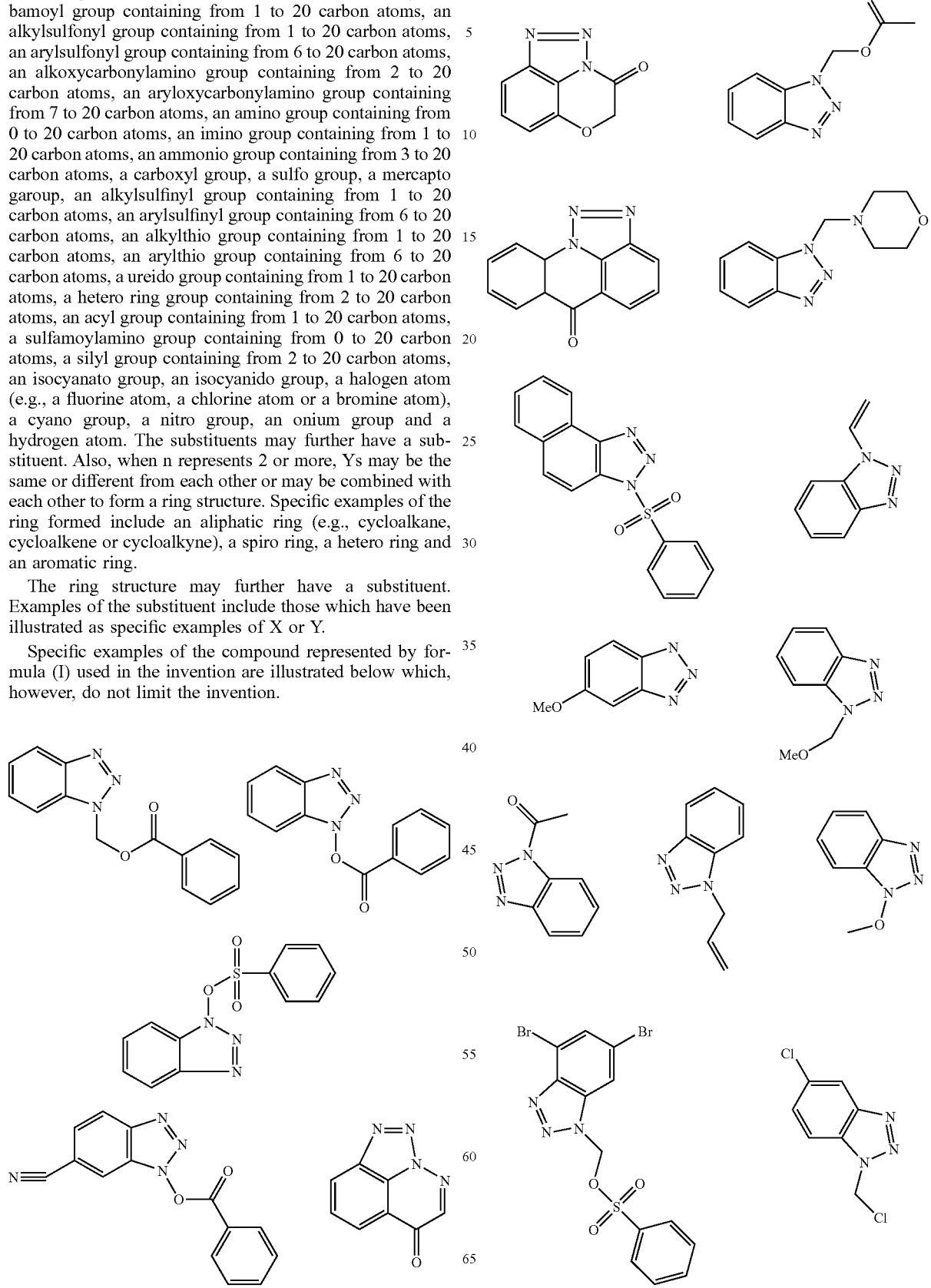

-continued
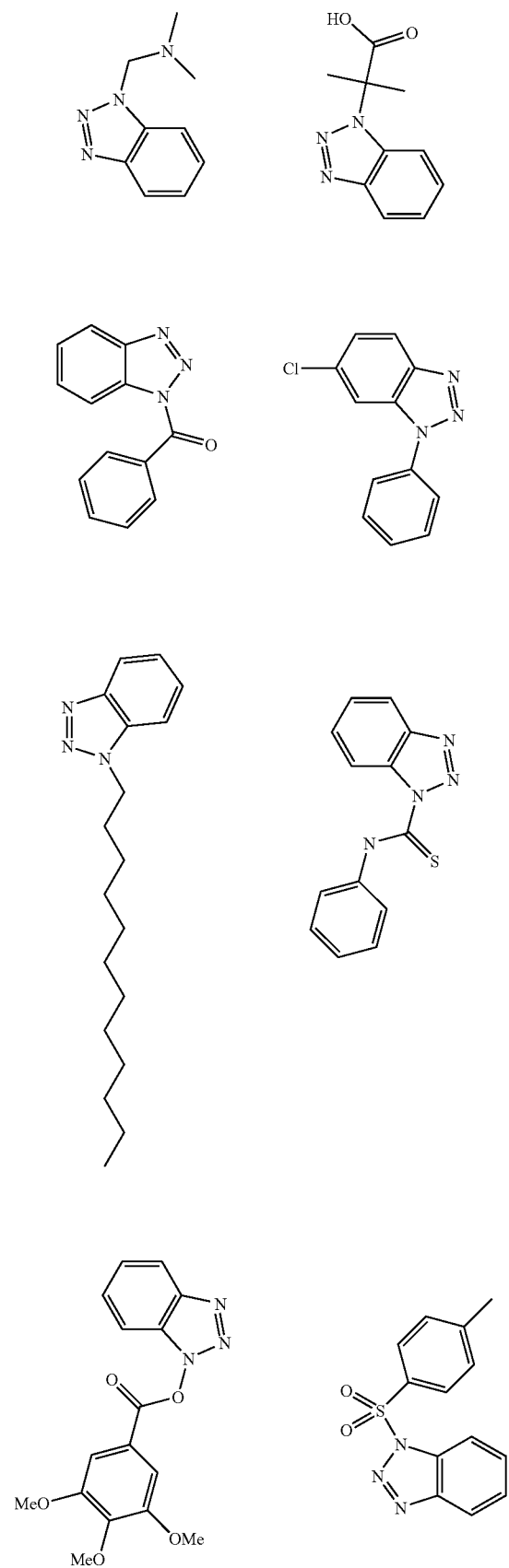
-continued
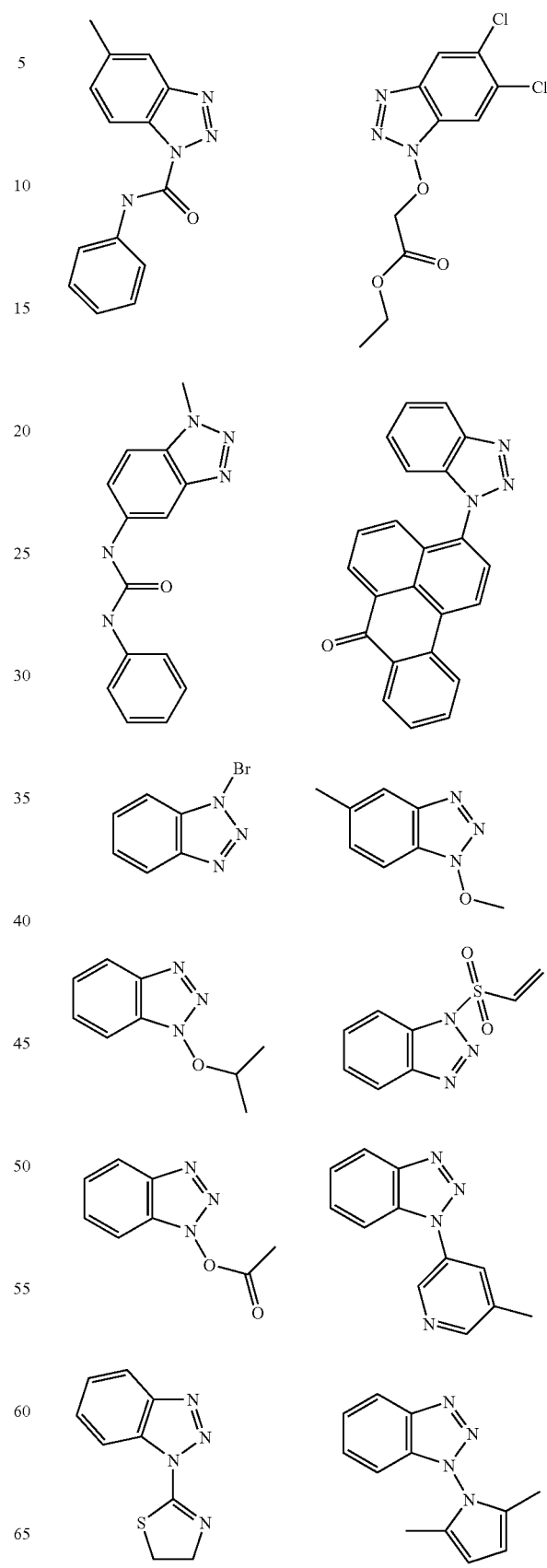

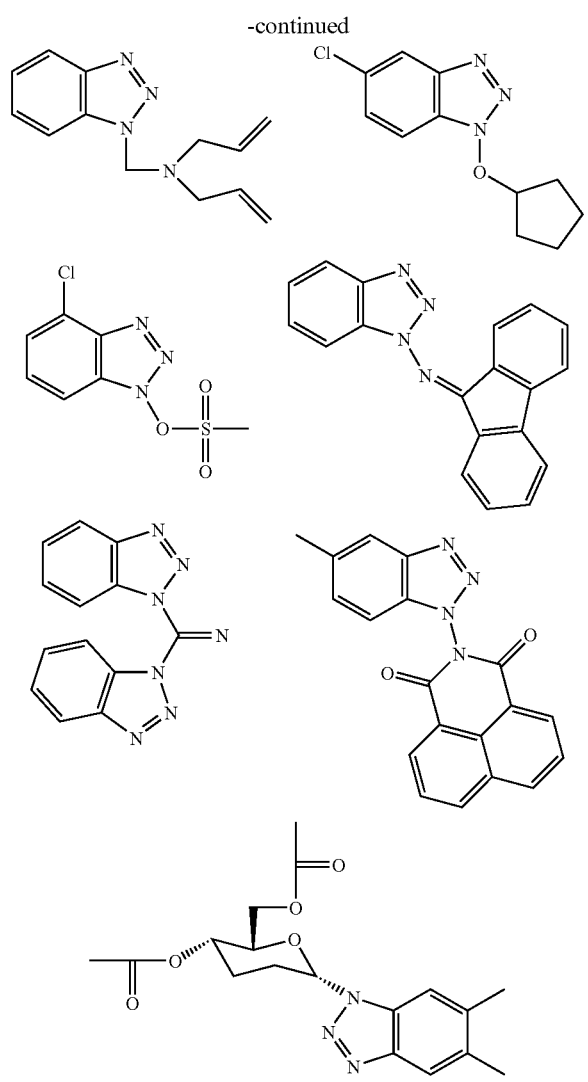

Of the compounds represented by formula (I), those represented by the following formula (II) or (III) are more preferred.

In the formulae, X' represents O, S or NZ', Z, Z' and Y each independently represents a monovalent substituent, n represents an integer of from 1 to 4 provided that, when n represents 2 or more, Ys may be the same or different from each other, or may be combined with each other to form a ring structure, W represents —C(=O)— or —S(=O)$_2$—, and m represents an integer of from 0 to 3.

m in formula (II) preferably represents 0 or 1 and, in view of stability, X' preferably represents O. Also, W in formula (III) preferably represents —C(=O)—.

Z, Z' and Y are the same as X and Y described with respect to formula (I).

Specific examples of the compound represented by formula (II) or (III) preferably used in the invention are illustrated below which, however, do not limit the invention in any way.

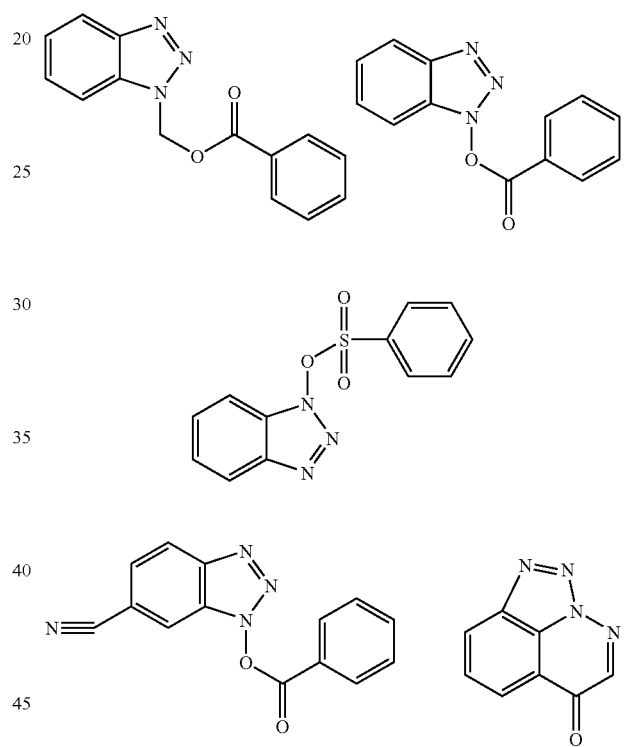

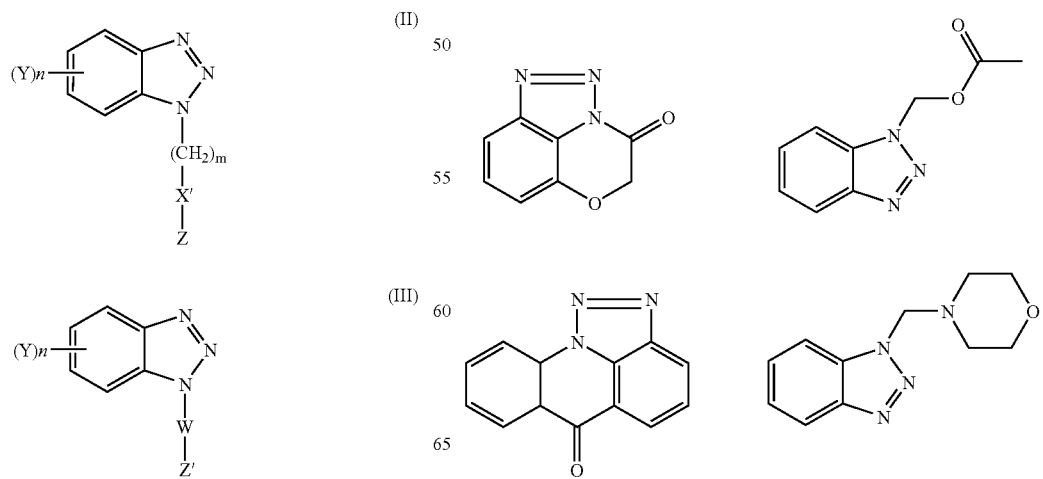

-continued
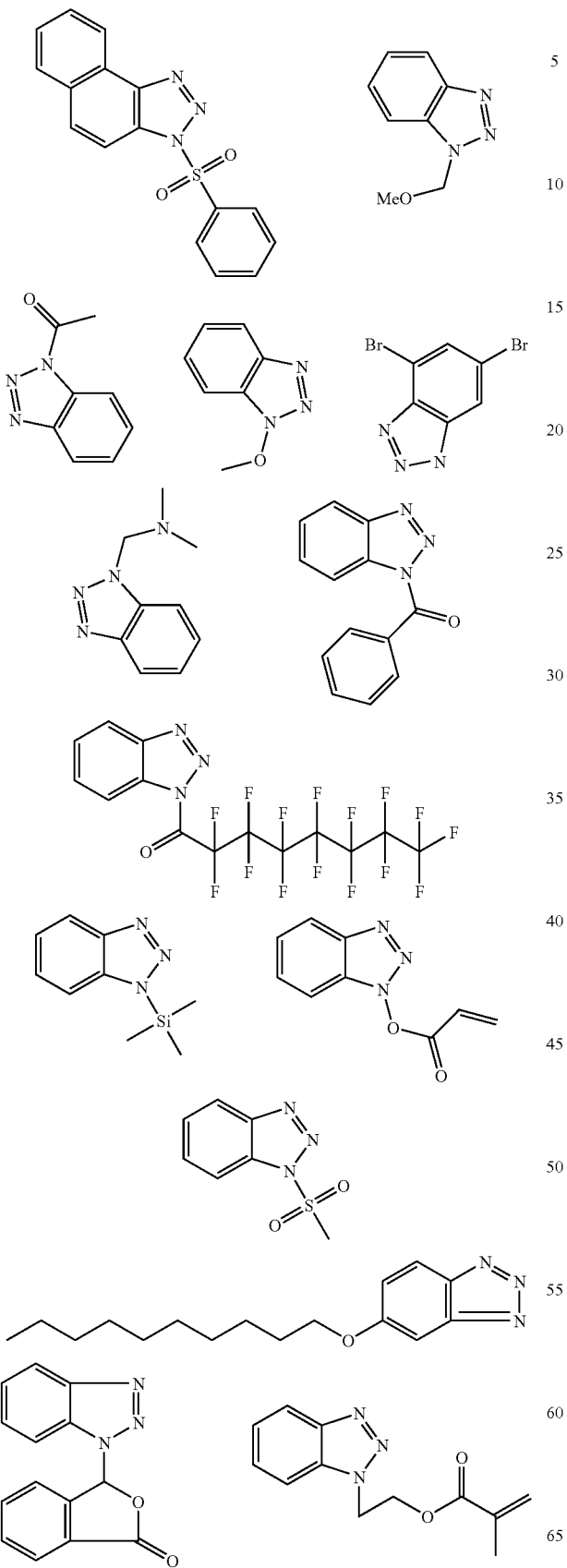
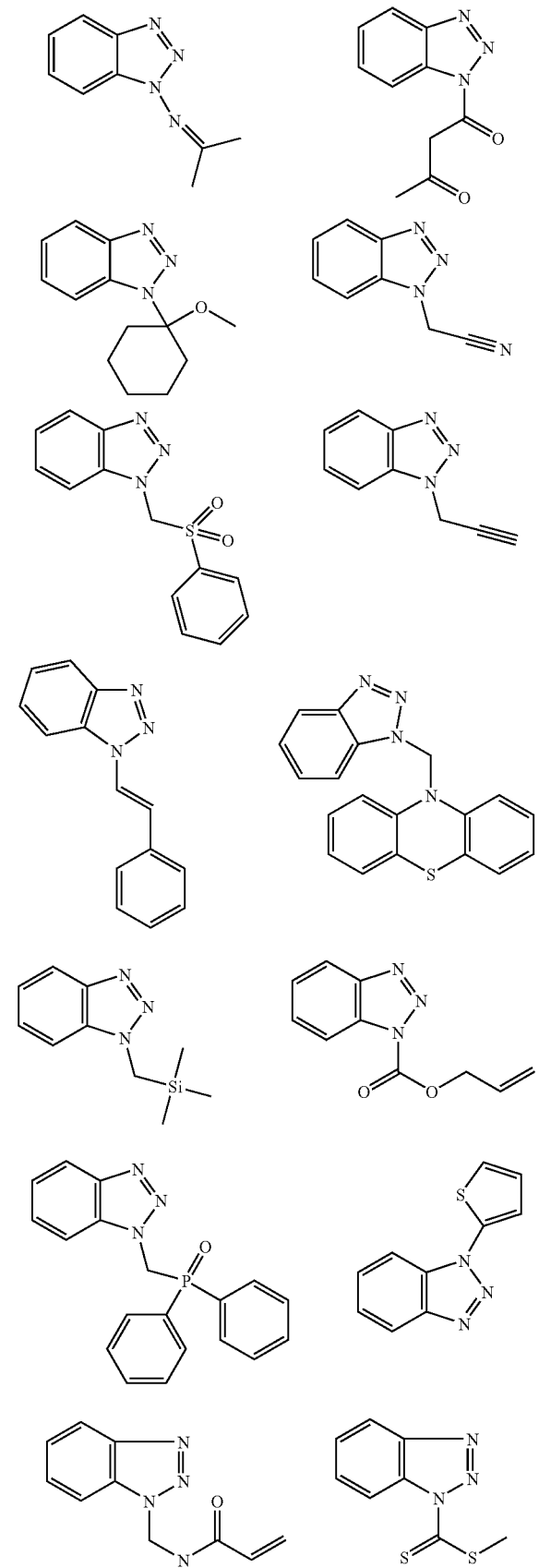

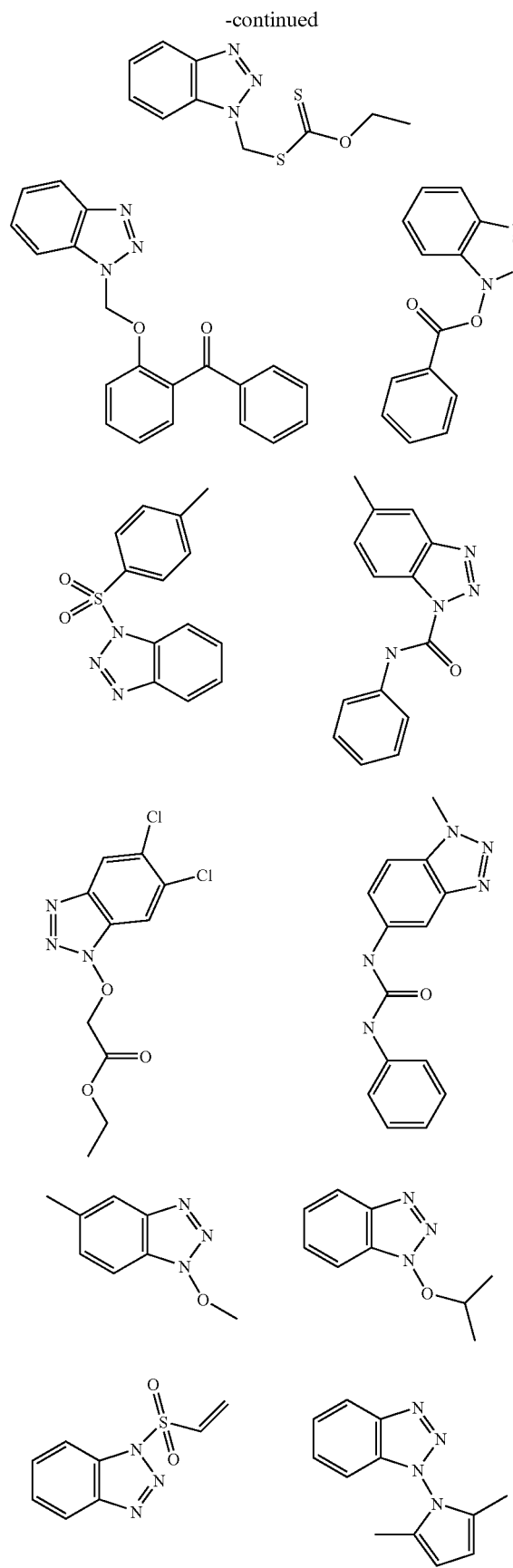
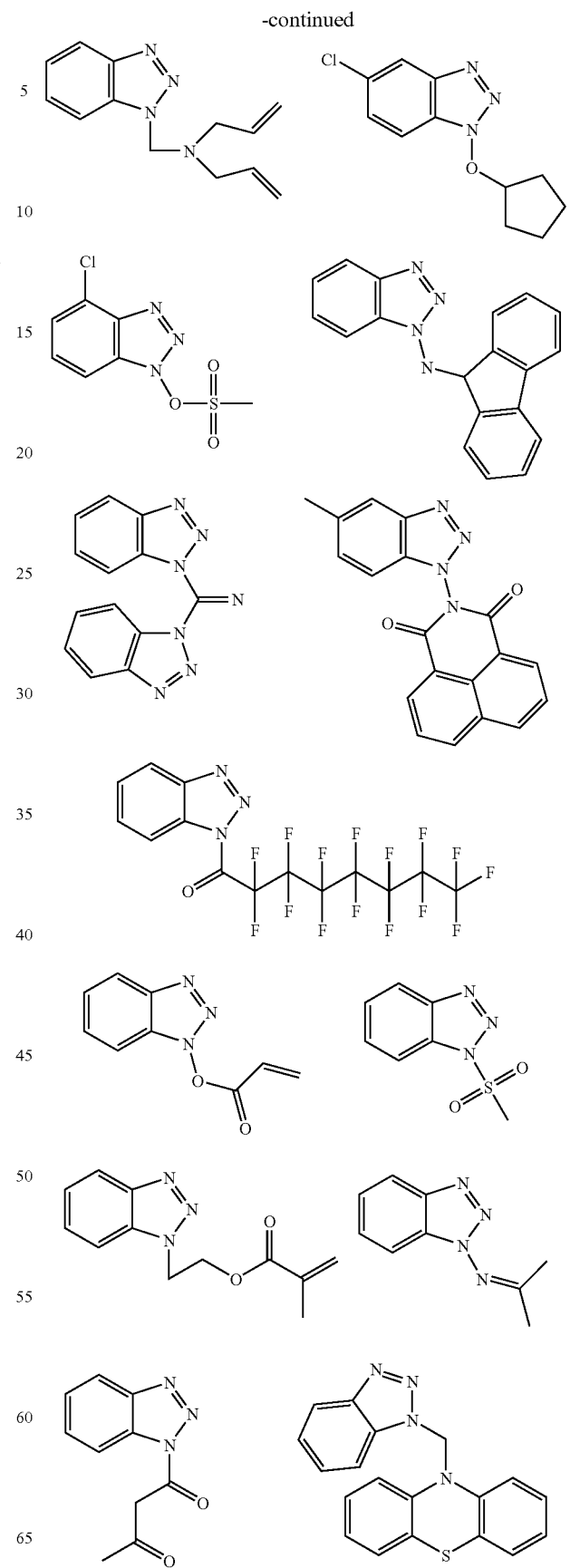

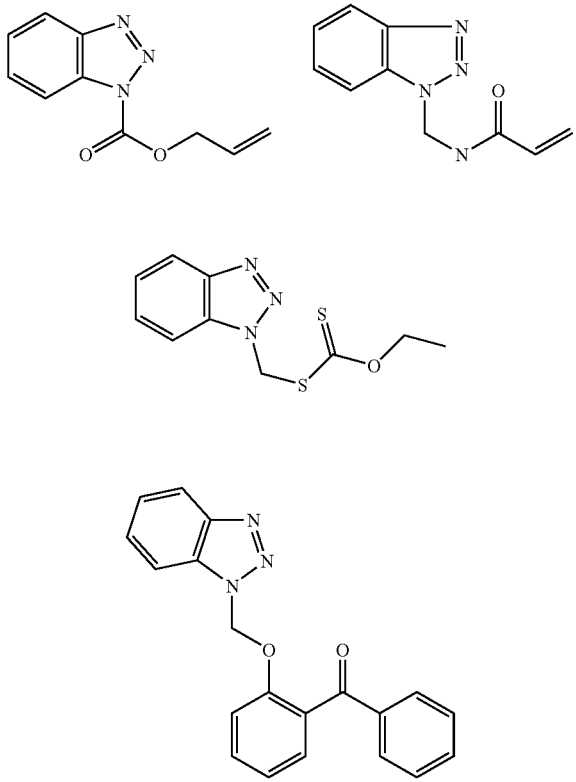

In the invention, the amount of the compound represented by formula (I) used can be appropriately decided depending upon designed performance of the light-sensitive material, and is preferably from 0.5 to 30 parts by weight, more preferably from 1 to 20 parts by weight, per 100 parts by weight of the components of the polymerizable composition.

Next, the sulfone compounds represented by formula (IV) are described below.

Specific examples of the monovalent group represented by $X^1$ or $y^1$ in formula (IV) include a straight-chain, branched-chain or cyclic alkyl group containing from 1 to 20 carbon atoms, a straight-chain, branched-chain or cyclic alkenyl group containing from 2 to 20 carbon atoms, an alkynyl group containing from 2 to 20 carbon atoms, an aryl group containing from 6 to 20 carbon atoms, an acyloxy group containing from 1 to 20 carbon atoms, an alkoxycarbonyloxy group containing from 2 to 20 carbon atoms, an aryloxycarbonyloxy group containing from 7 to 20 carbon atoms, a carbamoyloxy group containing from 1 to 20 carbon atoms, a carbonamido group containing from 1 to 20 carbon atoms, a sulfonamido group containing from 1 to 20 carbon atoms, a carbamoyl group containing from 1 to 20 carbon atoms, a sulfamoyl group containing from 0 to 20 carbon atoms, an alkoxy group containing from 1 to 20 carbon atoms, an aryloxy group containing from 6 to 20 carbon atoms, an aryloxycarbonyl group containing from 7 to 20 carbon atoms, an alkoxycarbonyl group containing from 2 to 20 carbon atoms, an N-acylsulfamoyl group containing from 1 to 20 carbon atoms, an N-sulfamoylcarbamoyl group containing from 1 to 20 carbon atoms, an alkylsulfonyl group containing from 1 to 20 carbon atoms, an arylsulfonyl group containing from 6 to 20 carbon atoms, an alkoxycarbonylamino group containing from 2 to 20 carbon atoms, an aryloxycarbonylamino group containing from 7 to 20 carbon atoms, an amino group containing from 0 to 20 carbon atoms, an imino group containing from 1 to 20 carbon atoms, an ammonio group containing from 3 to 20 carbon atoms, a carboxyl group, a sulfo group, a mercapto group, an alkyulsulfinyl group containing from 1 to 20 carbon atoms, an arylsulfinyl group containing from 6 to 20 carbon atoms, an alkylthio group containing from 1 to 20 carbon atoms, an arylthio group containing from 6 to 20 carbon atoms, a ureido group containing from 1 to 20 carbon atoms, a hetero ring group containing from 2 to 20 carbon atoms, an acyl group containing from 1 to 20 carbon atoms, a sulfamoylamino group containing from 0 to 20 carbon atoms, a silyl group containing from 2 to 20 carbon atoms, an isocyanato group, a hydroxyl group, an isocyanido group, a halogen atom (e.g., a fluorine atom, a chlorine atom or a bromine atom), a cyano group, a nitro group, an onium group and a hydrogen atom. The substituents may further have a substituent.

Also, when n represents 2 or more, $Y^1$s may be the same or different from each other or may be combined with each other to form a ring structure. Specific examples of the ring formed include an aliphatic ring (e.g., cycloalkane, cycloalkene or cycloalkyne), a spiro ring, a hetero ring and an aromatic ring.

The ring structure may further have a substituent. Examples of the substituent include those which have been illustrated as specific examples of $X^1$ or $Y^1$.

Specific examples of the compound represented by formula (IV) used in the invention are illustrated below which, however, do not limit the invention in any way.

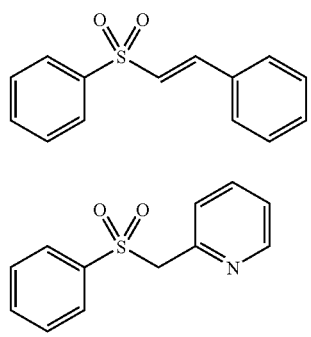

-continued
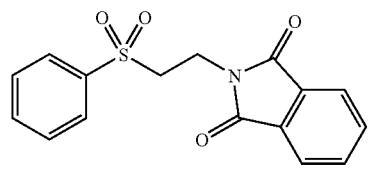
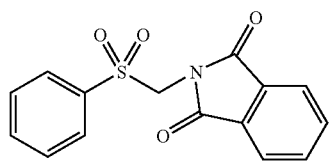
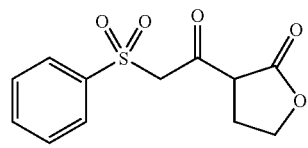
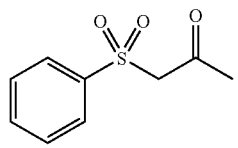
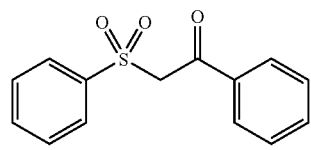
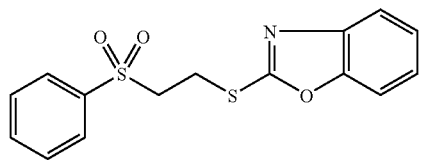
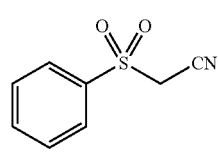
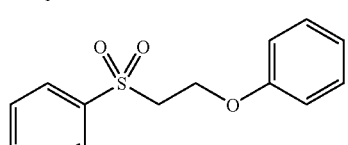
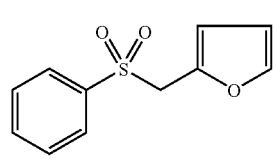
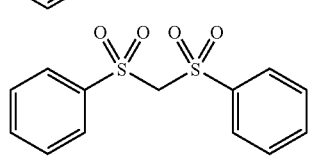
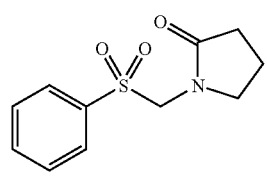
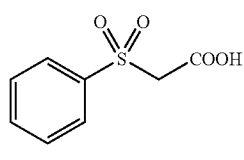
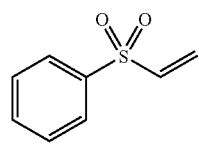
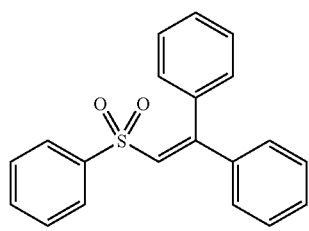
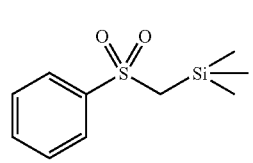
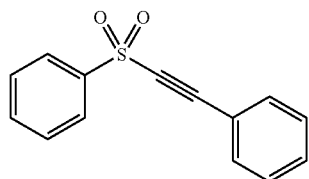
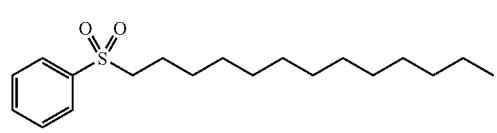
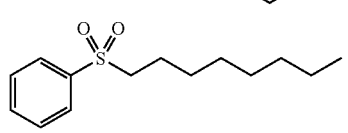
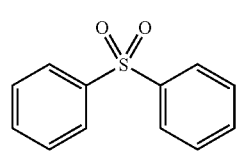
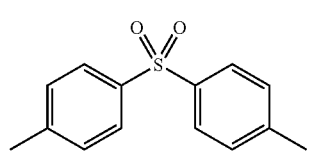

-continued
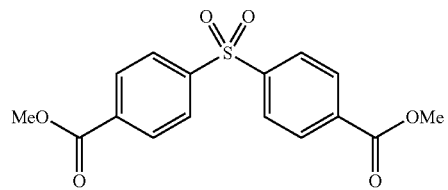
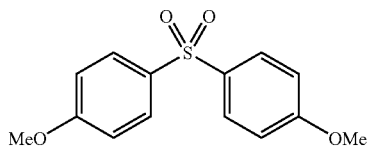
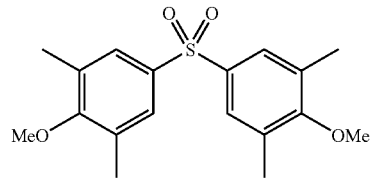
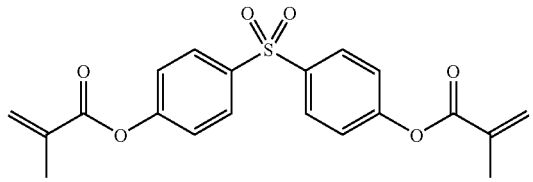
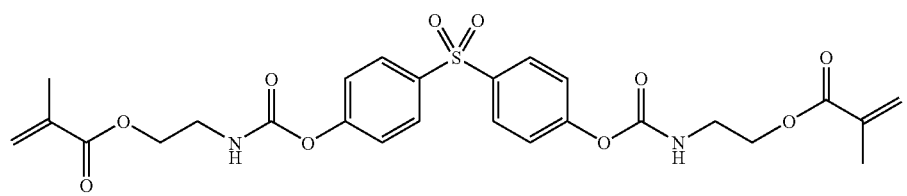
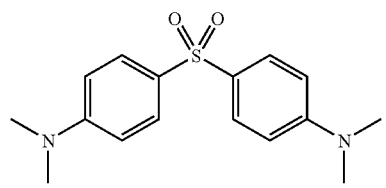
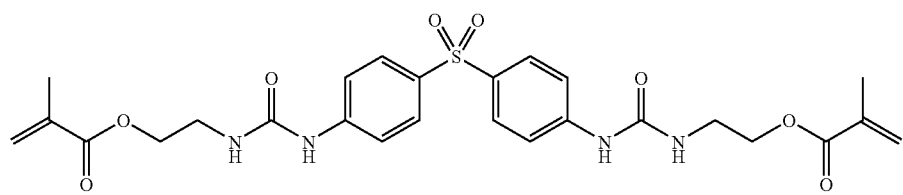
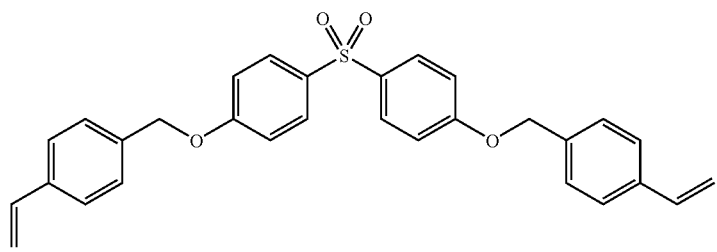
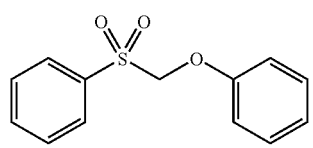
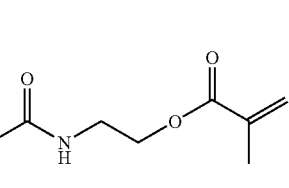
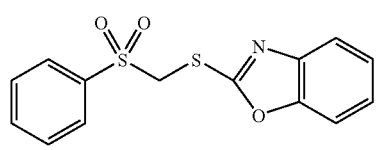
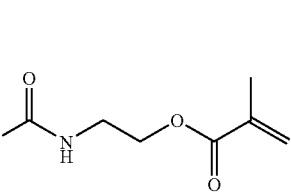
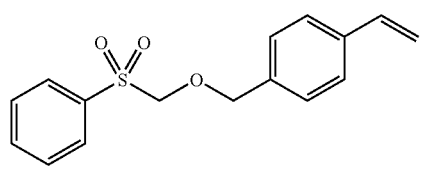
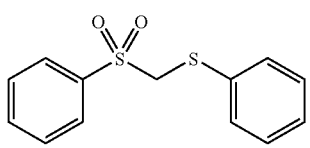
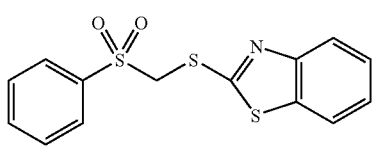
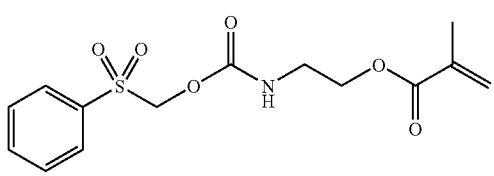

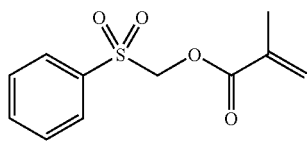
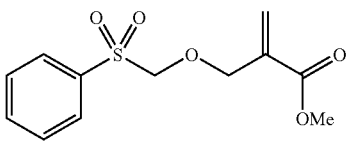

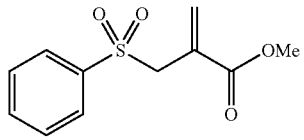
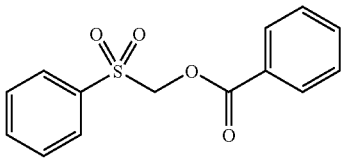

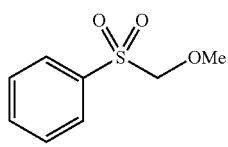
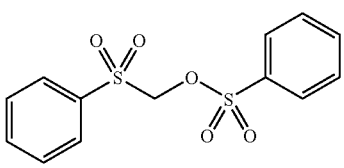

Of the compounds represented by formula (IV), those represented by the following formula (V) or (VI) are more preferred.

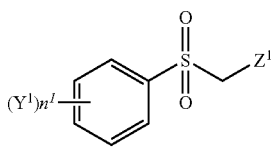
(V)

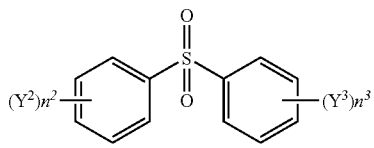
(VI)

In formulae (V) and (VI), $Y^1$ to $Y^3$ and $Z^1$ are the same as $X^1$ and $Y^1$ defined with respect to formula (IV). $n^1$ to $n^3$ each independently represents an integer of from 1 to 5 provided that, when $n^2$ or $n^3$ represents 2 or more, $Y^2$s or $Y^3$s may be the same or different from each other, or may be combined with each other to form a ring structure.

Further, of the compounds represented by formula (IV), those represented by the following formula (VII) are more preferred.

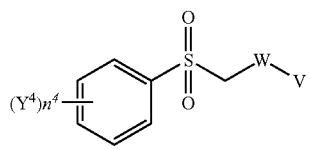
(VII)

In formula (VII), $Y^4$ and V are the same as $X^1$ and $Y^1$ defined with respect to formula (IV). $n^4$ represents an integer of from 1 to 5 provided that, when $n^4$ represents 2 or more, $Y^4$s may be the same or different from each other, or may be combined with each other to form a ring structure. W represents O or S atom.

Preferred specific examples of the compounds represented by formula (V) or (VI) are illustrated below which, however, do not limit the invention in any way.

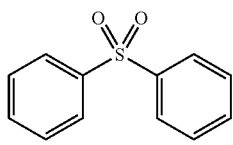
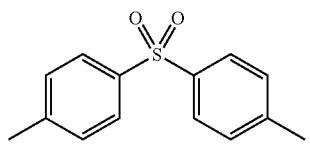

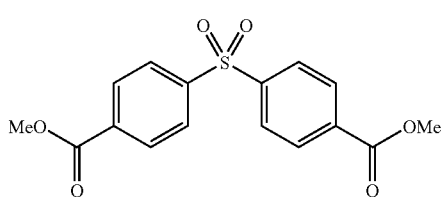
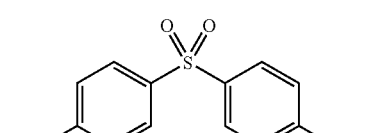

-continued
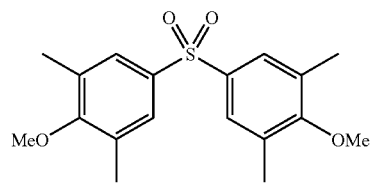
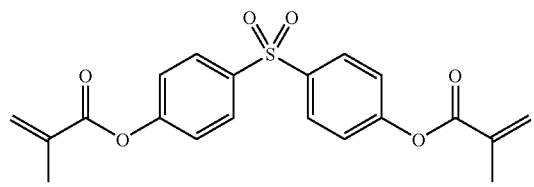
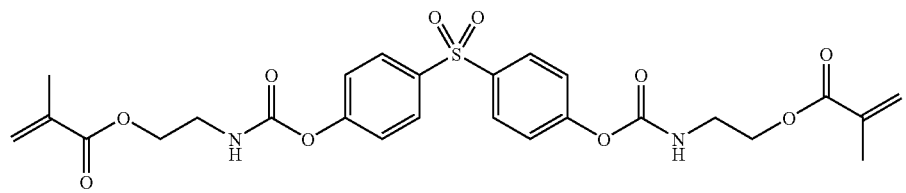
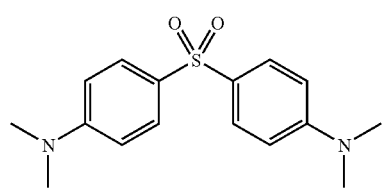
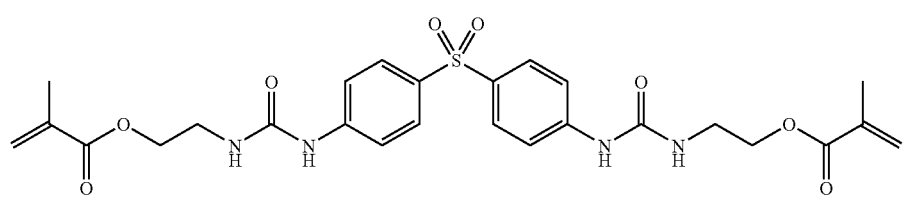
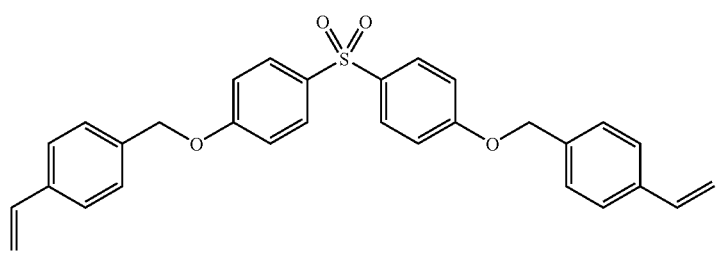
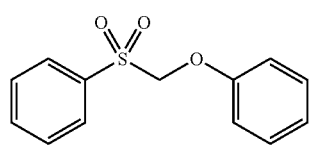
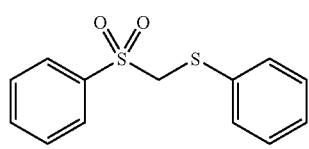
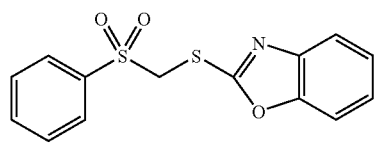
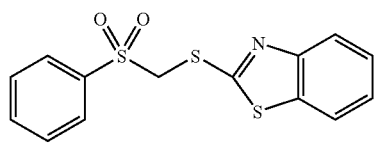
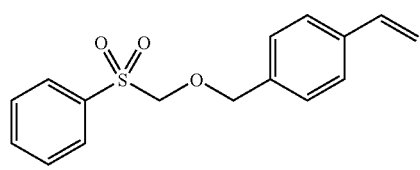
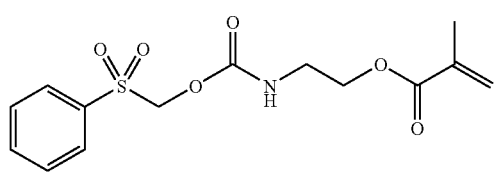
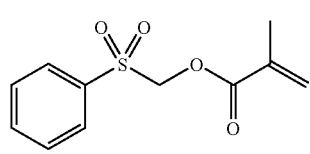
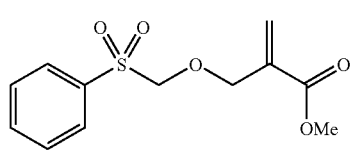

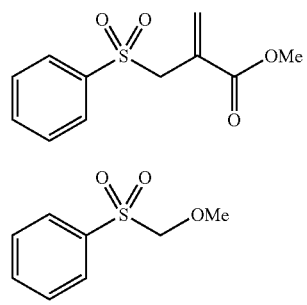
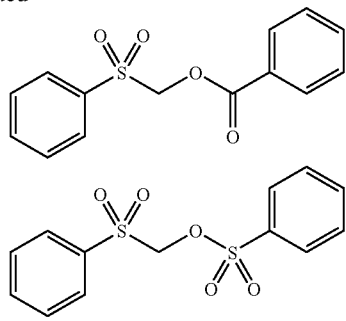

-continued

In the invention, the amount of the sulfone compound, preferably the compound represented by formula (IV), used can be appropriately determined depending upon the designed performance of the light-sensitive material, and is preferably from 0.5 to 40 parts by weight, more preferably from 1 to 30 parts by weight, per 100 parts by weight of the components of the polymerizable composition.

The polymerizable composition of the invention contains the benzotriazole compound or sulfone compound, a photopolymerization initiator and an ethylenic monomer (an addition polymerizable compound), and preferably further contains a binder polymer and other components. These components are specifically described below.

[Photopolymerization Initiating System]

[Sensitizing Dye]

Examples of preferred sensitizing dyes used in the invention include those which belong to the following compound groups and have an absorption wavelength in the region of from 350 nm to 450 nm.

Polynuclear aromatic compounds (e.g., pyrene, perylene and triphenylene), xanthenes (e.g., fluorescein, Eosine, erythrosine, Rhodamine B and Rose Bengale), cyanines (e.g., thiacarbocyanine and oxacarbocyanine), merocyanines (e.g., merocyanine and carbomerocyanine), thiazines (e.g., Thionine, Methylene Blue and Toluidine Blue), acridines (e.g., Acridine Orange, chloroflavine and acriflavine), anthraquinones (e.g., anthraquinone), and squaryliums (e.g., squarylium).

Examples of more preferred sensitizing dyes include those compounds represented by the following formulae (IX) to (XIII).

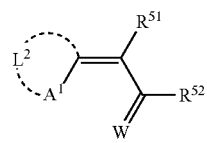

(IX)

In formula (IX), $A^1$ represents a sulfur atom or $NR^{50}$, $R^{50}$ represents an alkyl group or an aryl group, $L^2$ represents a non-metallic atomic group forming a basic nucleus of the dye together with the adjacent $A^1$ and the adjacent carbon atom, $R^{51}$ and $R^{52}$ each independently represents a hydrogen atom or a monovalent non-metallic atomic group, or $R^{51}$ and $R^{52}$ may be connected to each other to form an acidic nucleus of the dye, and W represents an oxygen atom or a sulfur atom.

Preferred specific examples of the compound represented by formula (IX) are illustrated below.

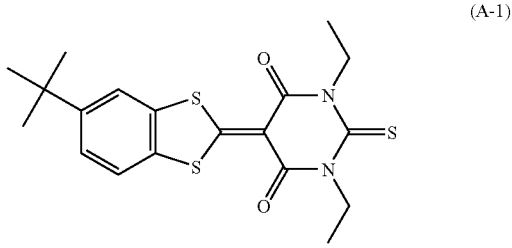

(A-1)

(A-2)

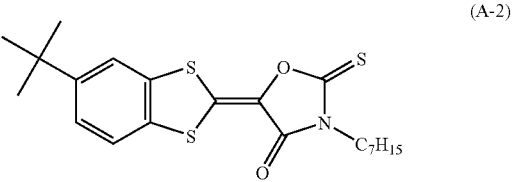

(A-3)

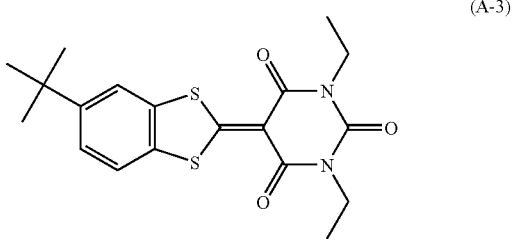

(A-4)

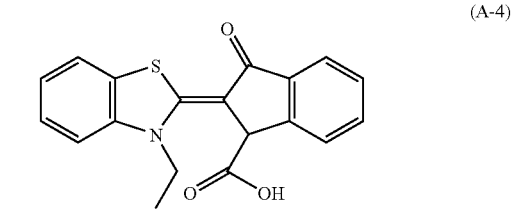

(A-5)

-continued

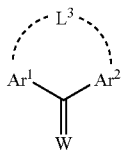
(X)

In formula (X), $Ar^1$ and $Ar^2$ each independently represents an aryl group and are connected to each other through $-L^3-$ bond, $L^3$ represents —O— or —S—, and W is the same as defined with respect to formula (IX).

Preferred specific examples of the compounds represented by formula (X) are illustrated below.

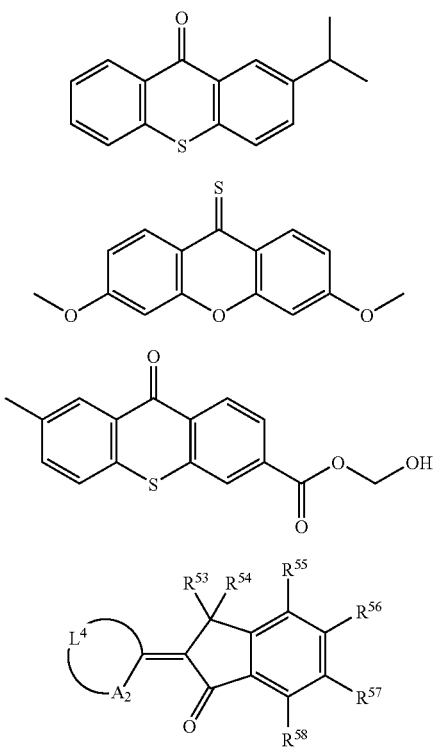

(A-6)

(A-7)

(A-8)

(XI)

In formula (XI), $A^2$ represents a sulfur atom or $NR^{59}$, $L^4$ represents a non-metallic atomic group forming a basic nucleus of the dye together with the adjacent $A^2$ and the carbon atom, $R^{53}$, $R^{54}$, $R^{55}$, $R^{56}$, $R^{57}$ and $R^{58}$ each independently represents a monovalent non-metallic atomic group, and $R^{59}$ represents an alkyl group or an aryl group.

Preferred specific examples of the compound represented by formula (XI) are illustrated below.

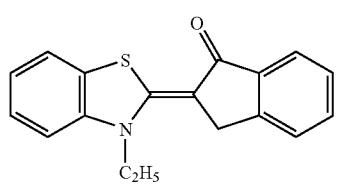

(A-9)

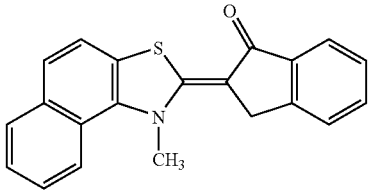

(A-10)

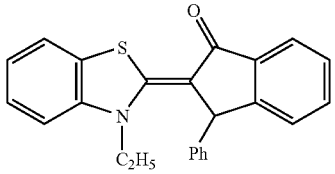

(A-11)

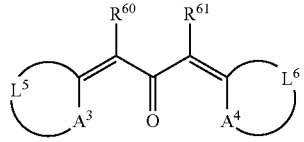

(XII)

In formula (XII), $A^3$ and $A^4$ each independently represents —S—, —$NR^{62}$— or —$NR^{63}$, $R^{62}$ and $R^{63}$ each independently represents a substituted or unsubstituted alkyl group or a substituted or unsubstituted aryl group, $L^5$ and $L^6$ each independently represents a non-metallic atomic group forming a basic nucleus together with the adjacent $A^3$ or $A^4$ and the adjacent carbon atom, $R^{60}$ and $R^{61}$ each independently represents a hydrogen atom or a monovalent non-metallic atomic group, or may be connected to each other to form an aliphatic or aromatic ring.

Preferred examples of the compound represented by formula (XII) are illustrated below.

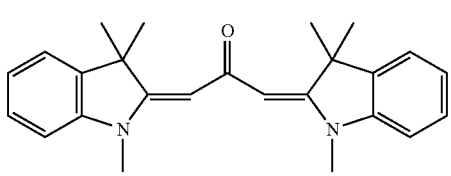

(A-12)

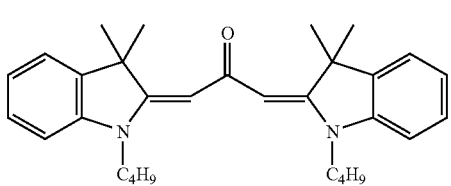

(A-13)

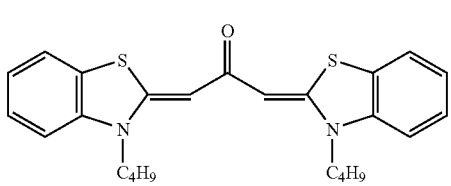

(A-14)

-continued

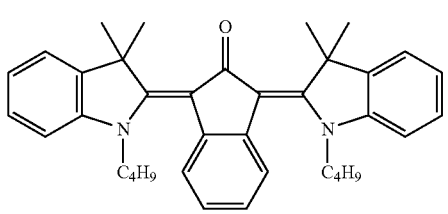
(A-15)

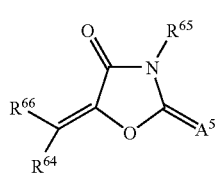
(XIII)

In, formula (XIII), $R^{66}$ represents an aromatic or hetero ring which may have a substituent, $A^5$ represents an oxygen atom, a sulfur atom or —$NR^{67}$—, $R^{64}$, $R^{65}$ and $R^{67}$ each independently represents a hydrogen atom or a monovalent non-metallic atomic group, and $R^{67}$ and $R^{64}$ or $R^{65}$ and $R^{67}$ may be connected to each other to form an aliphatic or aromatic ring.

Preferred specific examples of the compound represented by formula (XIII) are illustrated below.

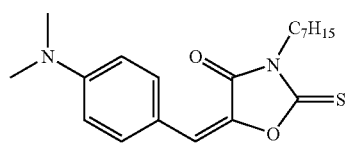
(A-16)

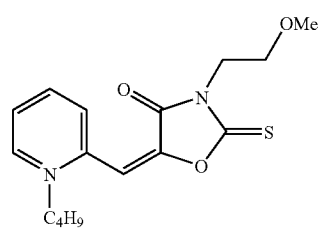
(A-17)

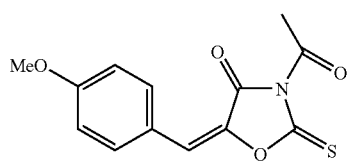
(A-18)

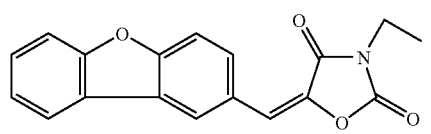
(A-19)

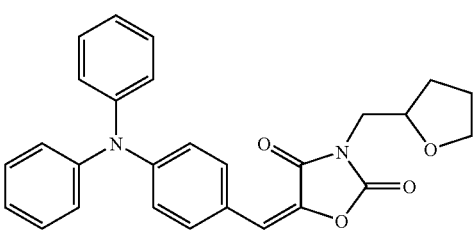
(A-20)

Regarding the sensitizing dye of the invention, it is possible, in the case of using for a lithographic printing plate precursor, to conduct various chemical modification for improving characteristics of the light-sensitive layer of the precursor. For example, the sensitizing dye may be connected to an addition polymerizable compound structure (e.g., an acryloyl group or a methacryloyl group) through a covalent bond, ionic bond or hydrogen bond to increase strength of exposed layer or depress unnecessary deposition of the dye from the exposed layer.

Further, in the case of preparing a lithographic printing plate precursor by using the polymerizable composition of the invention, introduction of a hydrophilic moiety (an acid group or a polar group, for example, a carboxyl group or an ester thereof, a sulfonic acid group or an ester thereof, or an ethylene oxide group) is effective for the purpose of enhancing processing adaptability using an (alkali) aqueous developing solution, which is a preferred embodiment of the light-sensitive layer. In particular, an ester type hydrophilic group has the characteristic aspect that, since it has a comparatively hydrophobic structure, it shows an excellent compatibility in the light-sensitive layer, and in the developing solution, it generates an acid group as a result of hydrolysis and shows an increased hydrophilicity. Besides, a substituent may be appropriately introduced, for example, for increasing compatibility in the light-sensitive layer or depressing deposition of crystals. For example, in a certain kind of light-sensitive system, an unsaturated bond, for example, an aryl group or an allyl group is extremely effective for increasing compatibility in some cases. Also, deposition of crystals can markedly be depressed by introducing steric hindrance between dye n-planes through a method of introducing a branched alkyl structure. Further, adhesion to an inorganic substance, for example, a metal or a metal oxide can be improved by introducing a phosphonic acid group, an epoxy group or a trialkoxysilyl group. Besides, a technique of polymerizing the sensitizing dye can be utilized according to the end use.

Details on the use of the sensitizing dye, for example, selection of the structure of the dye, selection between independent use and combined use of two or more of the dyes and decision of the addition amount may be appropriately determined according to the designed performance of the final light-sensitive material. For example, compatibility for the light-sensitive composition layer can be increased by using two or more sensitizing dyes in combination. Regarding selection of the sensitizing dye, molar extinction coefficient of the dye at the wavelength of a light emitted from a light source e used is an important factor as well as the light sensitivity. Since the addition amount of the dye can be comparatively reduced by using a dye having a large molar extinction coefficient, such a dye is economically advantageous and, when used for a lithographic printing plate precursor, the dye is advantageous in view of physical properties of the layer. The light sensitivity and resolving power of the light-sensitive layer and the physical properties of exposed layer are greatly influenced by the absorbance of the dye at the wavelength of a light source, and thus the addition amount of the dye is appropriately selected in consideration of these factors. For example, in using for a lithographic printing plate precursor wherein the layer has a comparatively small thickness, the dye is added in an amount so that the absorbance of the light-sensitive layer is in the range of preferably from 0.1 to 1.5, more preferably from 0.25 to 1. In the case of using as a lithographic printing plate precursor, the addition amount is usually from 0.05 to 30 parts by weight, preferably from 0.1 to 20 parts by weight, more preferably from 0.2 to 10 parts by weight, per 100 parts by weight of the component of the light-sensitive layer.

[Photopolymerization Initiator]

The photopolymerization initiator used in the invention is described below. The photopolymerization initiator used in the invention is a compound undergoes chemical change through action of light or interaction with electronically-excited state of sensitizing dye to generate at least any one of a radical, acid and base.

As the photopolymerization initiator, those known in the field of art can be used without limitation. Specifically, a large number of the photopolymerization initiators are described, for example, in Bruce M. Monroe, *Chemical Review*, 93, 435 (1993), R. S. Davidson, *Journal of Photochemistry and Photobiology A: Chemistry*, 73, 81 (1993), J. P. Fouassier, *Photoinitiated Polymerization-Theory and Applications*, Rapra Review, Vol. 9, Report, Rapra Technology (1998) and M. Tsunooka et al., *Prog. Polym. Sci.*, 21, 1 (1996). Further, a large number of compounds utilized in chemically amplified photoresists and photo-cation polymerization are described in Yuki Electronics Zairyo Kenkyukai, ed., *Imaging-yo Yuki Zairyo*, pages 187 to 192, Bun-Shin Publishing (1993). Moreover, compounds undergoing oxidatively or reductively cleavage of bond through interaction with electronically-excited state of sensitizing dye described, for example, in F. D. Saeva, *Topics in Current Chemistry*, 156, 59 (1990), G. G. Maslak, *Topics in Current Chemistry*, 168, 1 (1993), H. B. Shuster et al., *JACS*, 112, 6329 (1990) and I. D. F. Eaton et al., *JACS*, 102, 3298 (1980) are also known.

Preferred examples of the photopolymerization initiator include (a) an aromatic ketone, (b) an aromatic onium salt compound, (c) an organic peroxide, (d) a hexaarylbiimidazole compound, (e) a ketoxime ester compound, (f) a borate compound, (g) an azinium compound, (h) a metallocene compound, (i) an active ester compound, and (j) a compound having a carbon-halogen bond.

The aromatic ketone (a) preferably includes compounds having a benzophenone skeleton or a thioxantone skeleton described in J. P. Fouassier and J. F. Rabek, *Radiation Curing in Polymer Science and Technology*, pages 77 to 117 (1993). More preferred examples of the aromatic ketone (a) include α-thiobenzophenone compounds described in JP-B-47-6416, benzoin ether compounds described in JP-B-47-3981, α-substituted benzoin compounds described in JP-B-47-22326, benzoin derivatives described in JP-B-47-23664, aroylphophonic esters described in JP-A-57-30704, dialkoxybenzophenones described in JP-B-60-26483, benzoin ethers described in JP-B-60-26403 and JP-A-62-81345, α-aminobenzophenones described in JP-B-1-34242, U.S. Pat. No. 4,318,791 and European Patent 284,561, p-di (dimethylaminobenzoyl)benzene described in JP-A-2-211452, thio-substituted aromatic ketones described in JP-A-61-194062, acylphosphinesulfides described in JP-B-2-9597, acylphosphines described in JP-B-2-9596, thioxantones described in JP-B-63-61950, and coumarins described in JP-B-59-42864.

The aromatic onium salt compound (b) includes aromatic onium salts of elements of Groups V, VI and VII in the periodic table, specifically, N, P, As, Sb, Bi, O, S, Se or Te, and I. For example, iodonium salts described in European Patent 104,143, U.S. Pat. No. 4,837,124, JP-A-2-150848 and JP-A-2-296514, sulfonium salts described in European Patents 370,693, 233,567, 297,443, 297,442, 297,210 and 422,570, U.S. Pat. Nos. 3,902,144, 4,933,377, 4,760,013, 4,734,444 and 2,833,827, diazonium salts (e.g., benzene diazonium salt that may have a substituent), diazonium salt resins (e.g., formaldehyde resin of diazodiphenylamine), N-alkoxypiridium salts (e.g., those described, for example, in U.S. Pat. No. 4,743,528, JP-A-63-138345, JP-A-63-142345, JP-A-63-142346 and JP-B-46-42363, specifically, e.g., 1-methoxy-4-phenylpyridinium tetrafluoroborate), and compounds described in JP-B-52-14727, JP-B-52-14728 and JP-B-52-14729 are preferably used. As the active species, a radical or an acid is generated.

The organic peroxide (c) includes almost all organic compounds having one or more oxygen-oxygen bonds in the molecules thereof, and preferred examples thereof include peroxide esters, for example, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone and di-tert-butyldiperoxy isophthalate.

The hexaarylbiimidazole compound (d) includes, for example, lophine dimers described in JP-B-45-37377 and JP-B-44-86516, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The ketoxime ester compound (e) includes, for example, 3-benzoyloxyiminobutan-2-one, 3-acetoxyiminobutan-2-one, 3-propyonyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

The borate compound (f) as other example of the photopolymerization initiator in the invention includes compounds described in U.S. Pat. Nos. 3,567,453 and 4,343,891, European Patents 109,772 and 109,773.

The azinium compound (g) as other example of the photopolymerization initiator includes compounds having N—O bond described in JP-A-63-138345, JP-A-63-142345, JP-A-63-142346, JP-A-63-143537 and JP-B-46-42363.

The metallocene compound (h) as other example of the photopolymerization initiator includes titanocene compounds described in JP-A-59-152396, JP-A-61-151197, JP-A-63-41484, JP-A-2-249 and JP-A-2-4705, and iron-arene complexes described in JP-A-1-304453 and JP-A-1-152109.

Specific examples of the titanocene compound include dicyclopentadienyl-Ti-dichloride, dicyclopentadienyl-Ti-biphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis 2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)bis[2,6-difluoro-3-(pyr-1-yl)phenyl]titanium, bis(cyclopentadienyl)bis[2,6-difluoro-3-(methylsulfonamido)phenyl]titanium and bis(cyclopentadienyl)bis[2,6-difluoro-3-(N-butylpivaloylamino)phenyl]titanium.

The active ester compound (i) includes, for example, nitrobenzyl ester compounds described in European Patents 290,750, 46,083, 156,153, 271,851 and 388,343, U.S. Pat. Nos. 3,901,710 and 4,181,531, JP-A-60-198538 and JP-A-53-133022, iminosulfonate compounds described in European Patents 199,672, 84,515, 199,672, 44,115 and 101,122, U.S. Pat. Nos. 4,618,564, 4,371,605 and 4,431,774, JP-A-64-18143, JP-A-2-245756 and JP-A-4-365048, and compounds described in JP-B-62-6223, JP-B-63-14340 and JP-A-59-174831.

The compound having a carbon-halogen bond (j) preferably includes, for example, compounds described in Wakabayashi et al., *Bull. Chem. Soc. Japan*, 42, 2924 (1969), compounds described in British Patent 1,388,492, compounds described in JP-A-53-133428, and compounds described in German Patent 3,337,024.

Further, compounds described in F. C. Schaefer et al., *J. Org. Chem.*, 29, 1527 (1964), compounds described in JP-A-62-58241 and compounds described in JP-A-5-281728 are exemplified. Moreover, compounds described in German Patent 2,641,100, compounds described in German Patent 3,333,450, compounds described in German Patent 3,021,590 and compounds described in German Patent 3,021,599 are exemplified.

Specific preferred examples of the compounds (a) to (j) include those described below.

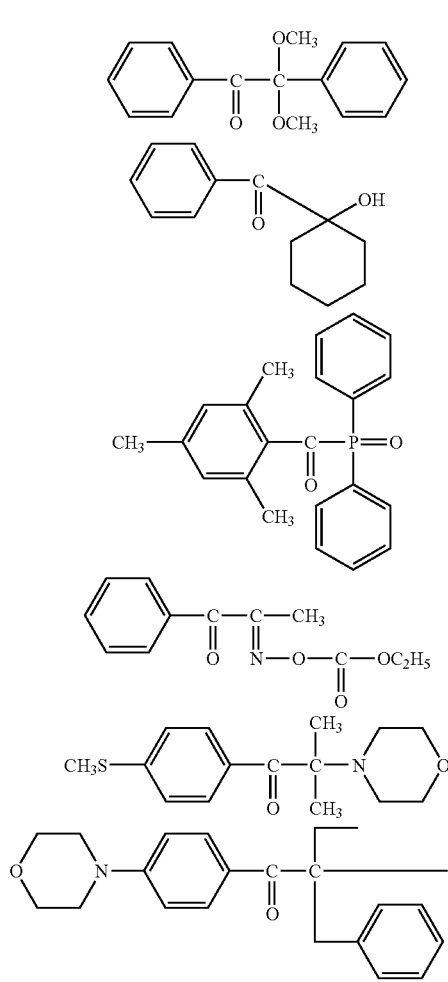

-continued

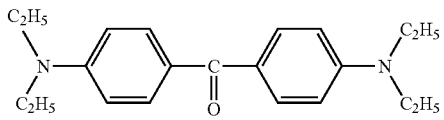

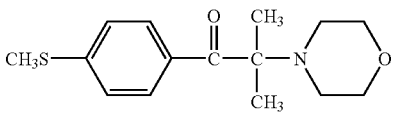

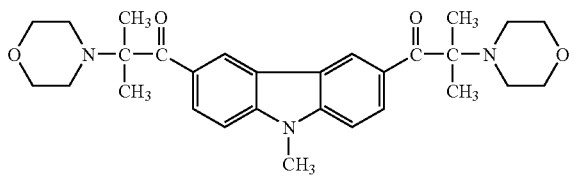

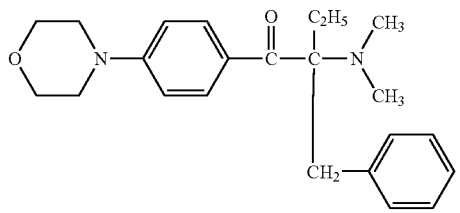

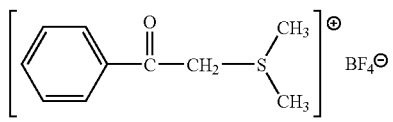

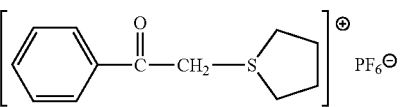

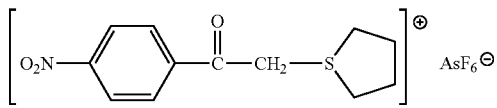

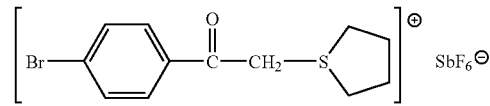

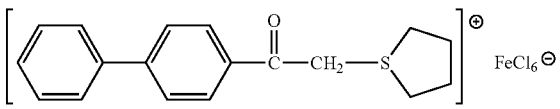

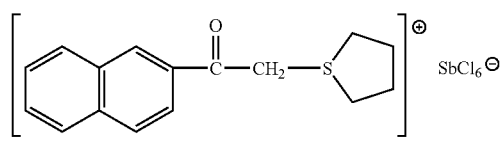

-continued
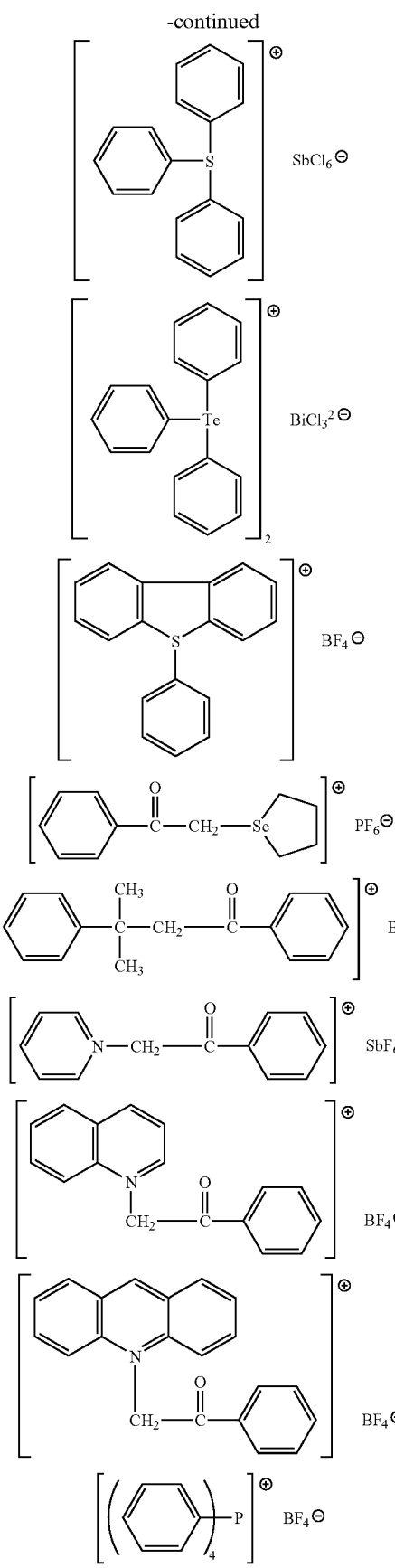
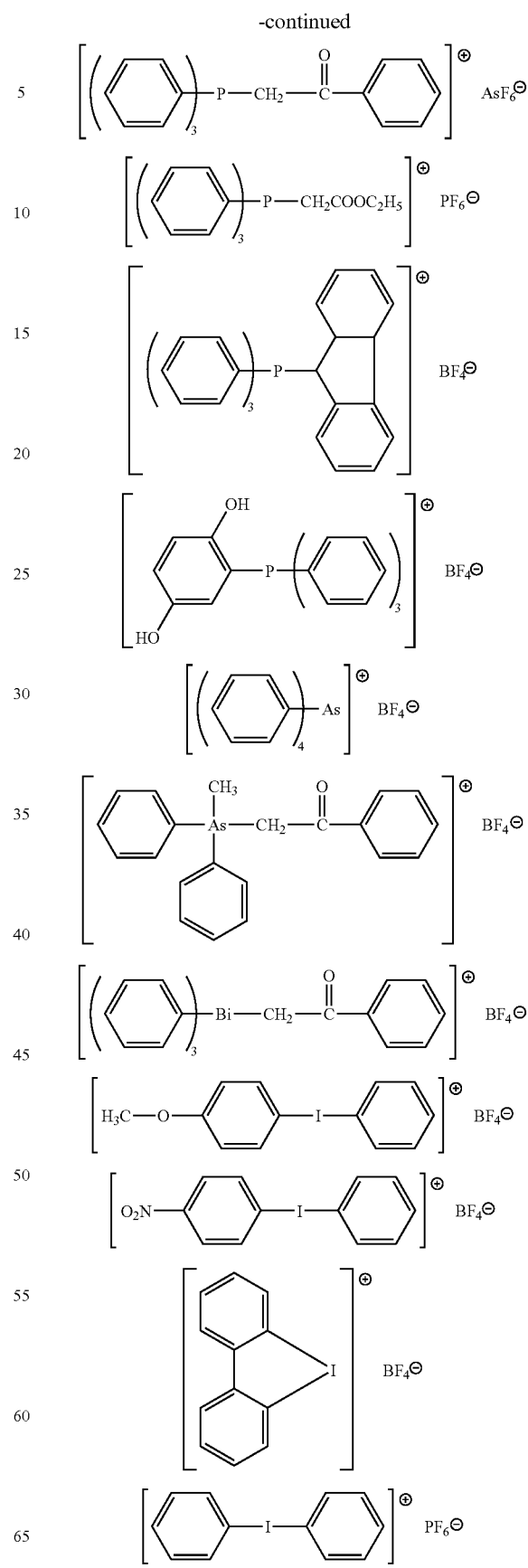

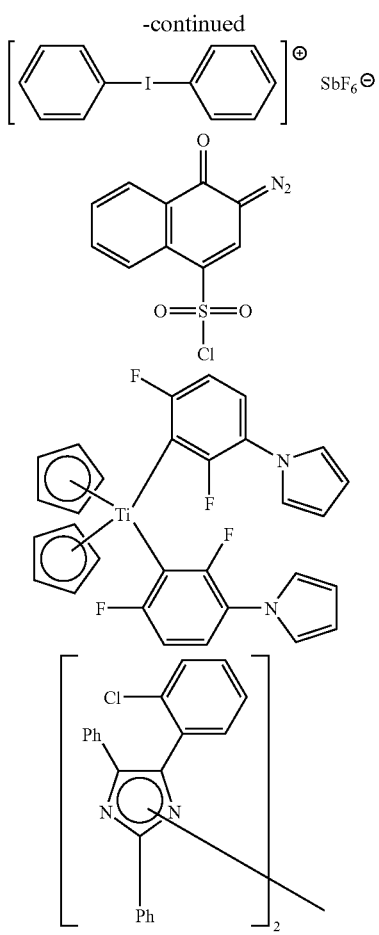

Of the photopolymerization initiators, the titanocene compound is particularly preferred in view of the improvement in sensitivity because it is apt to coordinate with the benzotriazole compound or sulfone compound described above to form the highly active species.

Like the foregoing sensitizing dye, the photopolymerization initiator can be subjected to various chemical modifications for further improving characteristics of the light-sensitive layer. There may be employed techniques, for example, connection to the sensitizing dye or to the addition polymerizable unsaturated compound or other radical-generating part, introduction of a hydrophilic moiety, introduction of a substituent for improving compatibility or depressing deposition of crystals, introduction of a substituent for improving adhesion property, and polymerization.

Regarding the method of using the photopolymerization initiator, a suitable method can be appropriately selected depending upon the designed performance of the light-sensitive material similar to the addition polymerizable compound described hereinafter and the sensitizing dye described hereinbefore. For example, compatibility with the light-sensitive layer can be enhanced by using two or more photopolymerization initiators in combination.

Regarding the amount of the photopolymerization initiator used, an increased amount of the photopolymerization initiator usually provides more advantages in view of light sensitivity. A sufficient light sensitivity can be obtained by using the photopolymerization initiator in an amount of from 0.5 to 80 parts by weight, preferably from 1 to 50 parts by weight, per 100 parts by weight of the component of the polymerizable composition. On the other hand, in consideration of the objects of the invention, the amount of the photopolymerization initiator is preferably small. By using the photopolymerization initiator in combination with the sensitizing dye, a sufficient light sensitivity can be obtained even when the amount of the photopolymerization initiator is reduced to as small as 30 parts by weight or less, further 25 parts by weight or less, still further 20 parts by weight or less, per 100 parts by weight of the component of the polymerizable composition.

[Ethylenic Monomer]

The ethylenic monomer (addition-polymerizable compound) used in the invention is described in detail below.

The addition-polymerizable compound preferably used has at least one ethylenically unsaturated double bond and is selected from among compounds having at least one, preferably two or more terminal ethylenically unsaturated bonds. Such compounds are widely known in this industrial field, and they can be used in the invention with no particular limitations. These are in the chemical form of, for example, monomer, prepolymer (i.e., dimmer, trimer or oligomer), a mixture thereof, and a copolymer thereof.

Examples of the monomer include unsaturated carboxylic acids (e.g., acrylic acid, methacrylic acid, itaconic acid, crotonic acid, isocrotonic acid and maleic acid), and the esters and amides thereof. Preferably, an ester between an unsaturated carboxylic acid and an aliphatic polyhydric alcohol compound and an amide between an unsaturated carboxylic acid and an aliphatic polyamine compound are used. Also, an addition reaction product between an unsaturated carboxylic acid ester or amide having a nucleophilic substituent, for example, a hydroxyl group, an amino group or a mercapto group and a mono-functional or poly-functional isocyanate or epoxy compound, and a dehydration condensation reaction product with a mono-functional or poly-functional carboxylic acid can preferably be used. Also, an addition reaction product between an unsaturated carboxylic acid ester or amide having an electrophilic substituent, for example, an isocyanato group or an epoxy group and a mono-functional or poly-functional alcohol, amine or thiol, and a substitution reaction product between an unsaturated carboxylic acid ester or amide having an eliminatable substituent, for example, a halogen atom or a tosyloxy group and a mono-functional or poly-functional alcohol, amine or thiol are preferred. As other examples, compounds which are obtained by using an unsaturated phosphonic acid, styrene or vinyl ether in place of the above-described unsaturated carboxylic acid can be used as well.

Specific examples of the monomer of the ester between the aliphatic polyhydric alcohol compound and an unsaturated carboxylic acid include acrylates, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer; methacrylates, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxypropoxy)phenyl]dimethylmethane and bis-[p-methacryloyloxyethoxy]phenyl]dimethylmethane; itaconates, for example, ethylene glydcol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonatates, for example, ethylene glycol dicrotonate, tetramethylene glycol dicrotonate, pentaerythritol dicrotonate and sorbitol tetracrotonate; isocrotonates, for example, ethylene glycol diisocrotonate, pentaerythritol diisocrotonate and sorbitol tetraisocrotonate; and maleates, for example, ethylene glycol dimaleate, triethylene glycol dimaleate, pentaerythritol dimaleate and sorbitol tetramaleate.

As examples of other esters, aliphatic alcohol esters described in JP-B-46-27926, JP-B-51-47334 and JP-A-57-196231, esters having an aromatic skeleton described in JP-A-59-5240, JP-A-59-5241 and JP-A-2-226149, and amino group-containing esters described in JP-A-1-165613 may also preferably be used The ester monomers described above may be used as a mixture thereof.

Also, specific examples of the amide monomer between an aliphatic polyamine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

As other examples of preferred amide type monomer, there are illustrated cyclohexylene structure-containing monomers described in JP-B-54-21726.

Urethane type addition-polymerizable compounds produced by using the addition reaction between an isocyanato group and a hydroxyl group are also preferred. Specific examples thereof include vinylurethane compounds having two or more polymerizable vinyl groups per molecule described in JP-B-48-41708, which are obtained by adding a hydroxyl group-containing vinyl monomer represented by the following formula (1) to a polyisocyanate compound having two or more isocyanato groups per molecule.

CH$_2$=C(R)COOCH$_2$CH(R')OH     (1)

wherein R and R' each independently represents H or CH$_3$.

Also, urethane acrylates described in JP-A-51-37193, JP-B-2-32293 and JP-B-2-16765 and urethane compounds having an ethylene oxide skeleton described in JP-B-58-49860, JP-B-56-17654, JP-B-62-39417 and JP-B-62-39418 are preferred.

Further, the use of addition polymerizable compounds having an amino structure or a sulfide structure within the molecule described in JP-A-63-277653, JP-A-63-260909 and JP-A-1-105238 can provide a light-sensitive layer having an extremely excellent light-sensitive speed.

As other examples, there may be illustrated polyester acrylates described in JP-A-48-64183, JP-B-49-43191 and JP-B-52-30490 and polyfunctional acrylates or methacrylates, for example, epoxyacrylates obtained by reacting an epoxy resin with (meth)acrylic acid. Also, there may be illustrated specific unsaturated compounds described in JP-B-46-43946, JP-B-1-40337 and JP-B-1-40336 and vinylsulfonic acid type compounds described in JP-A-2-25493. Further, in some cases, a perfluoroalkyl group-containing structure described in JP-A-61-22048 may preferably be used. Still further, photo-setting monomers and oligomers described in *Nippon Secchaku Kyokaishi*, vol.20, No.7, pp300-308 (1984) may be used.

Details on the use of the addition polymerizable compound, for example, selection of the structure of the compound, selection between independent use and combined use of two or more of the compounds, and decision of the addition amount, may be appropriately determined according to the designed performance of the final light-sensitive material. For example, they are determined from the following viewpoints.

In view of light-sensitive speed, a structure having a large amount of unsaturated group per molecule is preferred and, in many cases, structures having 2 or more of the functional group are preferred. Also, in order to enhance strength of cured layer, structures having three or more of the functional group are preferred. It is also effective to use in combination with a compound having a different number of the functional group or having a different polymerizable group (e.g., an acrylate, a methacrylate, a styrenic compound or a vinyl ether compound) to thereby adjust both light sensitivity and strength. Compounds having a large molecular weight or highly hydrophobic compounds may not be preferred in some cases in the point of developing speed or formation of deposition in a developing solution, though they are excellent in light-sensitive speed and layer strength. Also, compatibility with other components in the light-sensitive layer (e.g., a binder polymer, an initiator and a colorant) and dispersibility in the layer are important factors in selecting the kind and method for use of the addition-polymerizable compound. For example, use of a compound with a low purity or use of two or more of the compounds in combination can in some cases improve compatibility. Also, a specific structure can be selected for the purpose of improving adhesion to the support or the overcoat layer.

Regarding the amount of the addition-polymerizable compound, a large amount is advantageous with respect to sensitivity but, when the compounded in a too much amount, there can arise a problem in production steps due to stickiness of the light-sensitive layer (e.g., transfer of light-sensitive components or production failure due to stickiness) or a problem of forming deposition in the developing solution. In consideration of these points, a preferred amount is in many cases from 5 to 80% by weight, preferably from 25 to 75% by weight, based on the weight of the total component of the polymerizable composition. The addition-polymerizable compounds may be used independently or in combination of two or more thereof. Further, as to the use of the addition-polymerizable compounds, the structure, combination and amount may be appropriately selected in view of the degree of polymerization inhibition by oxygen, resolving power, fogging property, and change in refractivity and surface adhesion. In some cases, a layer structure, for example, an undercoat or an overcoat and a coating method may also be considered.

[Binder Polymer]

In using the polymerizable composition of the invention to a lithographic printing plate precursor, which is a preferred embodiment of the image-recording material using the composition, it is preferred to further use a binder polymer in the light-sensitive layer. As the binder polymer, a linear organic polymer is preferred to incorporate. The "linear organic polymer" is not particularly limited, and any such polymer may be used. Preferably, a linear organic polymer, which is soluble or swellable in water or weakly alkaline water and which enables development with water or weakly alkaline water is selected. The linear organic high molecular polymer is not only used as a film-forming agent for the photo-polymerizable composition but also appropriately selected according to the kind of the developing agent of water, weakly alkaline water or an organic solvent. For example, use of a water-soluble organic polymer enables development with water. Examples of the linear organic polymer include addition polymers having carboxylic acid group in the side chain thereof, for example, those described in JP-A-59-44615, JP-B-54-34327, JP-B-58-12577, JP-B-54-25957, JP-A-54-92723, JP-A-59-53836 and JP-A-59-71048, i.e., methacrylic acid copolymers, acrylic acid copolymers, itaconic acid copolymers, crotonic acid copolymers, maleic acid copolymers and partially esterified maleic acid copolymers. Also, there may be illustrated acidic cellulose derivatives having carboxylic acid group in the side chain thereof. Further, those obtained by adding a cyclic acid anhydride to an addition polymer having a hydroxyl group are useful.

Of these, [benzyl (meth)acrylate/(meth)acrylic acid/if desired, other addition polymerizable vinyl monomer] copolymers and [allyl (meth)acrylate/(meth)acrylic acid/if desired, other addition polymerizable vinyl monomer] copolymers are particularly preferred due to their well balanced the layer strength, sensitivity and developability.

Also, urethane-based, acid group-containing binder polymers described in JP-B-7-120040, JP-B-7-120041, JP-B-7-120042, JP-B-8-12424, JP-A-63-287944, JP-A-63-287947, JP-A-1-271741 and JP-A-11-352691 provide such an excellent strength that they are advantageous in the point of printing durability and low energy exposure adaptability.

Also, amido group-containing binders described in JP-A-11-171907 have excellent developability and layer strength, thus they are preferred.

Further, polyvinylpyrrolidone or polyethylene oxide is useful as a water-soluble organic polymer. In order to increase the strength of the cured layer, alcohol-soluble nylon or polyether between 2,2-bis(4-hydroxyphenyl)propane and epichlorohydrin is also useful.

The binder polymer can be mixed into the whole polymerizable composition in an appropriate amount. When mixed in an amount of more than 90% by weight, however, there tends to result non-favorable results in the point of image strength. Thus, the amount is preferably from 30 to 85% by weight. Also, the ratio of the addition polymerizable compound to the binder polymer is in the range of preferably from 1/9 to 7/3 by weight.

In a preferred embodiment, a substantially water-insoluble and alkali-soluble binder polymer is used. The use of such a binder polymer enables to eliminate the use of, or minimize the amount of, an environmentally unfavorable organic solvent as a developing solution. In such a case, an acid value (acid content per g of polymer in terms of chemical equivalent number) and a molecular weight of the binder polymer are appropriately selected in view of image strength and developability. The acid value is preferably from 0.4 to 3.0 meq/g, and the molecular weight is preferably in the range of from 3,000 to 500,000. The acid value is more preferably from 0.6 to 2.0 meq/g, and the molecular weight is more preferably in the range of from 10,000 to 300,000.

[Additives]

To the polymerizable composition of the invention may further be appropriately added other components adapted for the use and the production method. Preferred additives are described below.

(Co-Sensitizer)

The sensitivity can further be improved by adding a certain kind of additive (hereinafter referred to as "co-sensitizer"). Mechanism of the function of the co-sensitizer is not quite clear but, in many cases, it may presumably be based on the following chemical process. Specifically, it is believed that various intermediate active species (e.g., radicals, peroxides, oxidizing agents or reducing agents) generated by the photo reaction initiated upon absorption of light by the aforesaid initiation system and in the course of subsequent addition polymerization reaction react with the co-sensitizer to generate a new active radical. The co-sensitizers can be roughly grouped into: (a) those which are reduced to generate an active radical; (b) those which are oxidized to generate an active radical; and (c) those which react with a less active radical to convert to a more active radical or which function as a chain transfer agent. Regarding to which group individual compounds belong, there often exist no accepted theories. Compounds classified into groups (a) to (c) are described in detail below.

(a) Compounds being reduced to generate an active radical compounds having a carbon-to-halogen bond: The carbon-to-halogen bond is presumably reductively split to generate an active radical. Specifically, trihalomethyl-s-triazines and trihalomethyloxadiazoles are preferably used.

compounds having a nitrogen-to-nitrogen bond: The nitrogen-to-nitrogen bond is presumably reductively split to generate an active radical. Specifically, hexaarylbiimidazoles are preferably used.

compounds having an oxygen-to-oxygen bond: The oxygen-to-oxygen bond is presumably reductively split to generate an active radical. Specifically, organic peroxides are preferably used.

onium compounds: The carbon-to-hetero atom bond or the oxygen-to-nitrogen bond is presumably reductively split to generate an active radical. Specifically, diaryliodonium salts, triarylsulfonium salts and N-alkoxypyridinium (azinium) salts are preferably used.

Ferocene and iron-arene complexes: They reductively generate an active radical.

(b) Compounds to be oxidized to generate an active radical alkyl ate complexes: The carbon-to-hetero atom bond is presumably oxidatively split to generate an active radical. Specifically, triarylalkyl borates are preferably used.

alkylamine compounds: The C—X bond on the carbon atom adjacent to nitrogen atom is presumably split by oxidation to generate an active radical. Preferred examples of X include a hydrogen atom, a carboxyl group, a trimethylsilyl group and a benzyl group. Specific examples of the compound include ethanolamines, N-phenylglycines and N-trimethylsilylmethylanilines.

sulfur-containing or tin-containing compounds: Compounds having the structure obtained by replacing the nitrogen atom of the above-described amine compound by a sulfur atom or a tin atom can generate an active radical in the similar manner. Also, compounds having an S—S bond are known to exhibit the sensitizing effect through splitting of the S—S bond.

α-substituted methylcarbonyl compounds: The compounds can generate an active radical by oxidative splitting of a carbonyl-α carbon. Also, those in which the carbonyl group is converted to oxime ether exhibit the same action. Specific examples thereof include 2-alkyl-1-[4-(alkylthio)phenyl]-2-morpholino-pronone-1 compounds and oxime ethers obtained by reacting these compounds with a hydroxylamine and then etherifying the N—OH sulfinic acid salts: They can reductively generate an active radical. Specific examples thereof include sodium arylsulfinates.

(c) Compounds capable of reacting with a radical to convert it to a more active radical or capable of functioning as a chain transfer agent: For example, those compounds which have SH, PH, SiH or GeH in the molecule can be used. These impart hydrogen to a lowly active radical species to generate a radical or, after being oxidized, cause deprotonation to generate a radical. Specific examples thereof include 2-mercaptobenzimidazoles.

As more specific examples of the co-sensitizers, many compounds are described in JP-A-59-236913 as additives for increasing sensitivity. Part of them are illustrated below which, however, are not to be construed as limiting the invention.

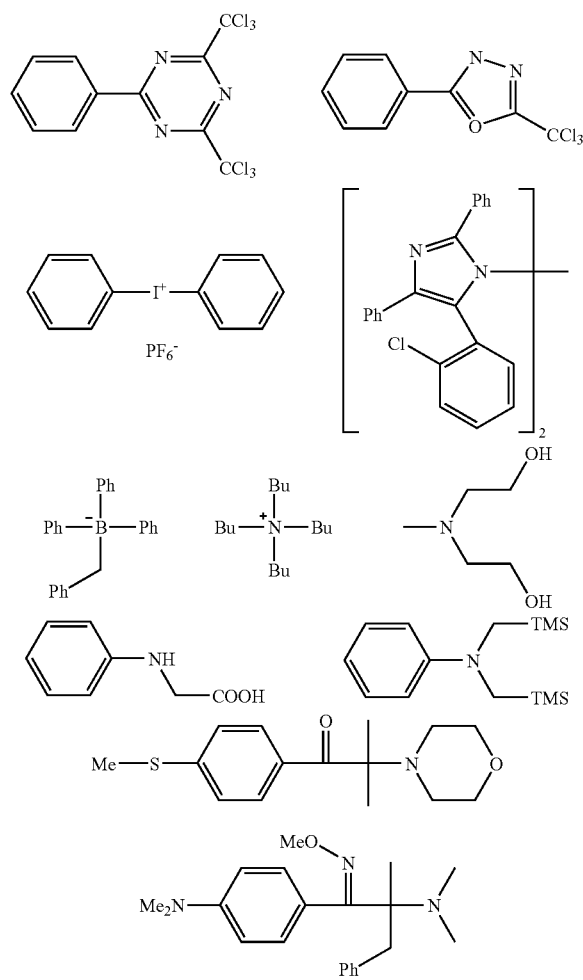

-continued

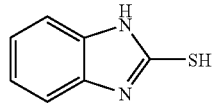

Like the sensitizing dye, the co-sensitizer can further be chemically modified in order to further improve characteristics of the light-sensitive layer. For example, techniques, for example, connection to a moiety of the sensitizing dye, active agent, addition polymerizable unsaturated compound and others, introduction of a hydrophilic moiety, introduction of a substituent for improving compatibility or depressing deposition of crystals, introduction of a substituent for improving adhesion and polymerization may be utilized.

The co-sensitizers can be used independently or in combination of two or more thereof. The amount thereof used is preferably in the range of from 0.05 to 100 parts by weight, more preferably from 1 to 80 parts by weight, still more preferably from 3 to 50 parts by weight, per 100 parts by weight of the addition polymerizable compound.

(Polymerization Inhibitor)

In the invention, it is also preferred to add a small amount of a thermal polymerization inhibitor in order to inhibit undesirable thermal polymerization of the addition polymerizable compound during production or storage of the polymerizable composition (hereinafter also referred to merely as "composition"). Suitable examples of the thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol) and N-nitrosophenylhydroxyamine cerium(III) salt. The addition amount of the thermal polymerization inhibitor is preferably from about 0.01% to about 5% by weight based on the weight of the whole composition. Also, if desired, a higher fatty acid derivative, for example, behenic acid or behenic acid amide may be added and allowed to exist at the surface of the light-sensitive layer in the course of the drying step after coating for the purpose of preventing inhibition of polymerization by oxygen. The addition amount of the higher fatty acid derivative is preferably from about 0.5% to about 10% by weight based on the weight of the whole composition.

(Colorants and the Like)

Further, in order to color the light-sensitive layer, a dye or a pigment may be added thereto. Visibility of a printing plate after the plate-making and adaptability for an image density-measuring machine, i.e., so-called plate inspecting property, can be improved by the addition. As the colorants, pigments are particularly preferred, because many dyes cause reduction in sensitivity of the light-sensitive layer. Specific examples thereof include pigments, e.g., phthalocyanine-based dyes, azo-based dyes, carbon black and titanium oxide, and dyes, e.g., Ethyl Violet, Crystal Violet, azo-based dyes, anthraquinone-based dyes and cyanine-based dyes. The addition amount of the dye or pigment is preferably from about 0.5% to about 5% by weight based on the weight of the entire composition.

(Protective Layer)

In the case of applying the polymerizable composition to a lithographic printing plate precursor for scanning exposure, it is preferred to further provide a protective layer on a layer of the polymerizable composition, because exposure is usually conducted in the atmosphere. The protective layer serves to prevent invasion of a low molecular compound, for example, oxygen or a basic substance existing in the atmosphere, which inhibits the image-forming reaction to be caused in the light-sensitive layer by exposure, into the light-sensitive layer and thus permits exposure in the atmosphere. Therefore, such protective layer is required to have a low permeability for low molecular compound, for example, oxygen, and preferably does not substantially inhibit transmission of light used for exposure, shows an excellent adhesion to the light-sensitive layer and can be easily removed in the developing step after the exposure. Such techniques have conventionally been employed and are described in detail in U.S. Pat. No. 3,458,311 and JP-A-55-49729. As a material used for the protective layer, a water-soluble high molecular compound having a comparatively excellent crystallinity is preferably used and, specifically, there is known a water-soluble polymer, for example, polyvinyl alcohol, polyvinyl pyrrolidone, acidic celluloses, gelatin, gum arabic or polyacrylic acid. Of these, use of polyvinyl alcohol as a major component provides the best results with respect to the fundamental properties, for example, oxygen barrier property and removability by development.

Polyvinyl alcohol used for the protective layer may be partly substituted by ester, ether and acetal as long as there remains enough unsubstituted vinyl alcohol unit to impart to the polymer necessary oxygen barrier property and solubility in water. Also, part of polyvinyl alcohol may have other copolymerizable component. As a specific example of polyvinyl alcohol, there are illustrated those which have a hydrolysis degree of from 71 to 100 mol % and a molecular weight in the range of from 300 to 2,400 in terms of weight-average molecular weight. Specific examples thereof include PVA-105, PVA-110, PVA-117, PVA-117H, PVA-120, PVA=124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 manufactured by Kuraray Co., Ltd.

Components (selection of PVA, use of additives) of the protective layer and the coating amount are selected in consideration of fogging property, adhesion and scratch resistance as well as the oxygen barrier property, development removability. Ordinarily, a higher hydrolysis degree of PVA used (a higher content of unsubstituted vinyl alcohol unit in the protective layer) and a larger thickness of the layer provide higher oxygen barrier property, thus being advantageous in the point of sensitivity. However, too high oxygen barrier property may give rise to the problem that undesirable polymerization reaction occurs during the production or preservation or that undesirable fog or thickening of image line occurs at the image exposure. Also, adhesion to the image area and scratch resistance are of extreme importance in handling the resulting plate. As countermeasures for the problems, it has been known to mix an additive, for example, an acrylic emulsion or a water-insoluble vinylpyrrolidone-vinyl acetate copolymer to the hydrophilic polymer mainly comprising polyvinyl alcohol in an amount of from 20 to 60% by weight and to coat on the polymerizable layer. The protective layer in the invention permits to apply thereto any of these known techniques. As to method of coating the protective layer, detailed descriptions are given in, for example, U.S. Pat. No. 3,458,311 and JP-A-55-49729.

Further, other functions may be imparted to the protective layer. For example, safe light adaptability can be more enhanced without causing reduction in the sensitivity by adding a colorant (e.g., a water-soluble dye) which well transmits a light of 350 to 450 nm used for the exposure and absorbs a light of 500 nm or more with a high efficiency.

(Other Additives)

Further, in order to improver physical properties of the cured layer, known additives, for example, inorganic filler, plasticizer or oil-sensitizing agent for improving ink-receptive property of the surface of the light-sensitive layer may be added.

Examples of the plasticizer include dioctyl phthalate, didodecyl phthalate, triethylene glycol dicaprylate, dimethylglycol phthalate, tricresyl phosphate, dioctyl adipate, dibutyl sebacate and triacetyl glycerin. In the case of using a binder (binder polymer), the plasticizer can be added in an amount of 10% by weight or less based on the total weight of the addition-polymerizable compound and the binder polymer.

Also, a UV initiator or a thermal crosslinking agent may be added to enhance the effects of heating and exposure after development for the purpose of improving film strength (printing durability) described hereinafter.

In addition, additives may be added or an interlayer may be provided for the purpose of improving adhesion between the light-sensitive layer and the support described hereinafter or enhancing removability of the unexposed light-sensitive layer by development. For example, the adhesion can be improved and printing durability can be enhanced by adding or undercoating a compound having a comparatively strong mutual action with the substrate, for example, a compound having a diazonium structure or a phosphone compound. Also, the developability of non-image area is improved and stain resistance is improved by adding or undercoating of a hydrophilic polymer, for example, polyacrylic acid or polysulfonic acid.

In coating the polymerizable composition onto a support described hereinafter, the composition is dissolved in a varying organic solvent. Examples of the solvent used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propyolene glycol monoethyl ether acetate, 3-methoxypropyl acetate, N,N-dimethylformamide, dimethylsulfoxide, y-butyrolactone, methyl lactate and ethyl lactate. The solvents may be used independently or in combination thereof. The concentration of solid component in the coating solution is suitably from 2 to 50% by weight.

The coating amount of the light-sensitive layer on the support has influence mainly on the sensitivity and developability of the light-sensitive layer and on strength and printing durability of exposed layer, and hence it is desirable to appropriately select the amount according to the use. In case when the coating amount is too small, the printing durability is insufficient. On the other hand, in case when too much, decreased sensitivity and a prolonged exposing time and, further, a prolonged development processing may occur, thus too much coating amount not being preferred.

With a lithographic printing plate precursor for scanning exposure, which is a main object of the invention, the coating amount is suitably from about 0.1 to about 10 g/m$^2$, more preferably from 0.5 to 5 g/m$^2$, in terms of dry weight.

[Support]

In the case of using the polymerizable composition of the invention for a lithographic printing plate precursor, the photo-polymerizable, light-sensitive layer comprising the aforementioned composition is usually provided on a support.

The support used in the invention is preferably a dimensionally stable plate-like material. Examples thereof include paper, paper laminated with plastic (e.g., polyethylene, polypropylene or polystyrene), a plate of metal (e.g., aluminum, zinc or copper), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or a plastic film laminated with or having deposited thereon the above-described metal. The surface of the support may also be subjected to a known appropriate physical or chemical treatment, if desired, so as to impart hydrophilicity or improve the strength.

Among the supports, preferred are paper, a polyester film and an aluminum plate, and more preferred is the aluminum plate because it is dimensionally stable and relatively inexpensive and can have a surface excellent in the hydrophilicity and strength imparted by a surface treatment, if desired. Also, a composite sheet obtained by bonding an aluminum plate onto a polyethylene terephthalate film described in JP-B-48-18327 may preferably be used.

The aluminum substrate is a dimensionally stable metal plate containing aluminum as a major component, and is selected from a pure aluminum plate, an alloy plate containing aluminum as a major component and a trace amount of foreign elements, and a plastic film or paper laminated with or having deposited thereon aluminum (or alloy thereof).

In the following descriptions, the substrate comprising aluminum or aluminum alloy described above is collectively referred to as an "aluminum substrate". Examples of the foreign element contained in the aluminum alloy include silicon, iron, manganese, copper, magnesium, chromium, zinc, bismuth, nickel and titanium. The foreign element content in the alloy is 10% by weight or less. In the invention, a pure aluminum plate is preferred. However, since it is difficult to produce a completely pure aluminum in view of the refining technology, aluminum containing a trace amount of foreign elements may be used. Thus, the composition of the aluminum plate for use in the invention is not limited and an aluminum plate comprising conventionally known and used materials, for example, JIS A 1050, JIS A 1100, JIS A 3103 or JIS A 3005, may be appropriately utilized. The aluminum plate used in the invention has a thickness of from about 0.1 to about 0.6 mm, preferably from 0.15 to 0.4 mm, particularly preferably from 0.2 to 0.3 mm. The thickness can appropriately be changed depending upon the size of a printing machine, the size of a printing plate and the demands of users. The aluminum substrate may or may not be subjected to a surface treatment for the substrate described hereinafter.

[Surface Roughening Treatment]

The aluminum substrate used as a support is usually subjected to a surface roughening treatment.

The surface roughening method includes a method of mechanically roughening the surface, a method of chemical etching and a method of electrolytic graining, as disclosed in JP-B-56-28893. Further, there may be employed a electrochemically surface roughening method of electrochemically roughening the surface in an electrolytic solution of hydrochloric acid or nitric acid and a mechanically surface roughening method, for example, a wire brush graining method of scratching the aluminum surface with a metal wire, a ball graining method of graining the aluminum surface with graining balls and an abrasive and a brush graining method of roughening the surface with a nylon brush and an abrasive. The surface roughening methods may be employed individually or in combination thereof.

Of the methods, the electrochemical method of chemically roughening the surface in an electrolytic solution of hydrochloric acid or nitric acid is an advantageous surface roughening method, and an appropriate anodic time electricity is in the range of from 50 to 400 C/dm$^2$. Specifically, it is preferred to conduct alternating current and/or direct current electrolysis in an electrolytic solution containing 0.1 to 50% hydrochloric acid or nitric acid under the conditions of 20 to 80° C. in temperature, 1 second to 30 minutes in time and 100 to 400 C/dm$^2$ in electric current density.

Also, a support having on the surface a grained form of a structure wherein a specific middle wave structure and a specific small wave structure are superposed described in JP-A-2003-112484 can preferably be used.

The thus surface-roughened aluminum plate may be chemically etched with an acid or an alkali. Etching agents preferably used include, e.g., sodium hydroxide, sodium carbonate, sodium aluminate, sodium metasilicate, sodium phosphate, potassium hydroxide and lithium hydroxide. A preferred concentration is in the range of from 1 to 50%, and a preferred temperature is in the range of from 20 to 100° C. Washing with an acid is conducted for removing smut remaining on the etched surface. Examples of the acid used include nitric acid, sulfuric acid, chromic acid, hydrofluoric acid and borofluoric acid. As a specific method for desmutting after the electrochemically surface roughening treatment, there are illustrated a method of contacting with sulfuric acid of from 50 to 90° C. in temperature and from 15 to 65% by weight in concentration described in JP-A-53-12739 and a method of etching with an alkali described in JP-B-48-28123.

Methods and conditions are not particularly limited as long as the treated surface has a center-line average roughness, Ra, of from 0.1 to 0.8 μm.

[Anodizing Treatment]

The thus surface-roughened aluminum substrate is then subjected to an anodizing treatment to form thereon an oxide film.

In the anodizing treatment, sulfuric acid, phosphoric acid, oxalic acid and an aqueous solution of boric acid/sodium borate are used independently or combination of two or more thereof as a major component of an electrolytic bath. In this occasion, at least ingredients commonly contained in an aluminum alloy plate, electrodes, city water and ground water may of course be contained in the electrolytic solution. Further, a second and a third component may be added. Examples of the second and third components include a cation, for example, an ion of metal, e.g., Na, K, Mg, Li, Ca, Ti, Al, V, Cr, Mn, Fe, Co, Ni, Cu or Zn or ammonium ion and an anion, for example, nitrate ion, carbonate ion, chloride ion, phosphate ion, fluoride ion, sulfite ion, titanate ion, silicate ion and borate ion. They are allowed to be contained in a concentration of from 0 to 10,000 ppm. Though conditions of the anodizing treatment are not particularly limited, the treatment is preferably conducted by direct current or alternating current electrolysis of from 30 to 500 g/liter, from 10 to 70° C. in temperature and from 0.1 to 40 A/m² in electric current density. The thickness of the formed anodic oxide film is in the range of from 0.5 to 1.5 µm, preferably from 0.5 to 1.0 µm.

The treating conditions are preferably selected so that the resulting support has an anodic oxide film containing micropores of from 5 to 10 nm in pore size and from $8 \times 10^{15}$ to $2 \times 10^{16}$ per m² in population.

Further, it is also preferred to undercoat the thus-treated substrate with a water-soluble resin (e.g., polyvinylphosphonic acid, a polymer or copolymer having sulfonic acid group in the side chain thereof or polyacryic acid), a water-soluble metal salt (e.g., zinc borate), a yellow dye or an amine salt. Still further, a sol-gel treated substrate to which a functional group capable of causing addition reaction with a radical is connected through a covalent bond disclosed in JP-A-7-159983 is preferably used.

As a further preferred example, a support comprising any substrate having a water-resistant hydrophilic layer as a surface layer is exemplified. Examples of the surface layer include a layer comprising an inorganic pigment and a binder described in U.S. Pat. No. 3,055,295 and JP-A-56-13168, a hydrophilic swellable layer described in JP-A-9-80744, and a sol-gel film comprising titanium oxide, polyvinyl alcohol and a silicic acid described in JP-T-8-507727. (The term "JP-T" as used herein means a published Japanese translation of a PCT patent application). The hydrophilizing treatment is conducted for the purpose of rendering the surface of the support hydrophilic, and for the purpose of preventing harmful reactions of the light-sensitive layer provided thereon and improving adhesion to the light-sensitive layer.

[Interlayer]

In the photo-polymerizable image-recording material of the invention, an interlayer may be provided for the purpose of improving adhesion between the light-sensitive layer and the support and improving stain-resisting property. Specific examples of the interlayer include those described in JP-B-50-7481, JP-A-54-72104, JP-A-59-101651, JP-A-60-149491, JP-A-60-232998, JP-A-3-56177, JP-A-4-282637, JP-A-5-16558, JP-A-5-246171, JP-A-7-159983, JP-A-7-314937, JP-A-8-202025, JP-A-8-320551, JP-A-9-34104, JP-A-9-236911, JP-A-9-269593, JP-A-10-69092, JP-A-10-115931, JP-A-10-161317, JP-A-10-260536, JP-A-10-282682, JP-A-11-84674, JP-A-10-69092, JP-A-10-115931, JP-A-11-38635, JP-A-11-38629, JP-A-10-282645, JP-A-10-301262, JP-A-11-24277, JP-A-11-109641, JP-A-10-319600, JP-A-11-84674, JP-A-11-327152, JP-A-2000-10292, JP-A-2000-235254, JP-A-2000-352824, JP-A-2001-209170 and JP-A-2002-229187.

The interlayer can also function as an undercoat layer of a colorant on the support halving been described hereinbefore by adding a colorant to the component of the interlayer.

The image-recording material using the polymerizable composition of the invention is usually imagewise exposed, and the unexposed area of the light-sensitive layer is removed with a developing solution to form an image.

Besides, in the plate-making process wherein the image-recording material using the polymerizable composition of the invention is used as a lithographic printing plate precursor, the whole surface thereof may be heated before or during exposure or between exposure and development.

Such heating provides the advantages that the image-forming reaction in the light-sensitive layer is accelerated and that sensitivity or printing durability is improved or sensitivity is stably maintained during storage. Further, whole post-heating or whole exposure of the developed image is effective for improving image strength and printing durability. It is ordinarily preferred to conduct heating prior to the development under mild condition of 150° C. or lower. Heating at a too high temperature would give rise to the problem that even the non-image area is fogged. Heating after the development is conducted under quite strong condition, ordinarily in the range of from 200 to 500° C. Heating at a too low temperature would lead to an insufficient image-strengthening effect, whereas heating at a too high temperature gives rise to the problems of deterioration of a support and thermal decomposition of the image area.

As a method for exposing the scanning exposure-type lithographic printing plate precursor in accordance with the invention, any known method may be used with no limitations. The wavelength of a light source is appropriately from 300 to 600 nm, preferably 450 nm or less, for example, from 350 to 450 nm. Specifically, an InGaN semiconductor laser is preferred. Exposing mechanism may be any of inner drum type, outer drum type and flat bed type can be used. Use of highly water-soluble components as the components of the light-sensitive layer of the invention can render the composition soluble in neutral water or weakly alkaline water. When a lithographic printing plate precursor of such composition is loaded on a press machine, imagewise exposure and development can be performed on the machine.

Also, the developed light-sensitive lithographic printing plate precursor is subjected to after-treatments with washing water, a rinsing solution containing a surfactant and a desensitizing solution containing gum arabic or a sugar derivative. For the after-treatment of the light-sensitive lithographic printing plate precursor, these treatments may be employed in various combinations thereof.

The lithographic printing plate thus-obtained is mounted on an offset press machine to produce many prints.

The light-sensitive lithographic printing plate precursor can be developed with a known developing solution to form an image. It is particularly preferred in view of image-forming property and depression of occurrence of development scum to use a special developing solution described below, which has a pH of 13.0 or less.

The conventionally known developing solution includes a developing solution described in JP-B-57-7427, and an aqueous solution of an inorganic alkali agent, e.g., sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia or an organic alkali agent, e.g., monoethanolamine or diethanolamine is appropriate. The alkali agent is added so that the concentration thereof becomes from 0.1 to 10% by weigh t, preferably from 0.5 to 5% by weight.

The alkaline aqueous solution may contain, if desired, a small amount of a surfactant or an organic solvent, e.g., benzyl alcohol, 2-phenoxyethanol or 2-butoxyethanol. Examples thereof include those described in U.S. Pat. No. 3,375,171 and 3,615,480. Further, developing solutions described in JP-A-50-26601, JP-A-58-54341, JP-B-56-39464 and JP-B-56-42860 are exemplified.

Also, the special developing solution is at present considered to be a developing solution satisfying the following requirements.

First, to function to provide extremely good image-forming performance (i.e., to show high developing ability for the non-exposed area and low permeating property into the exposed area, not to swell the light-sensitive layer, and to dissolve successively from the surface of the light-sensitive layer).

Second, to completely remove the light-sensitive layer in the non-exposed area and regenerate the support surface as a hydrophilic surface not causing any printing stain.

Third, to contain a nonionic compound having a hydrophobic site capable of performing mutual action with insoluble compounds insoluble in the developing solution and a hydrophilic site for stably dispersing them in water, in order for stably dispersing or solubilizing them.

Fourth, to have a low salt concentration in order to prevent salting out or reduction in developing speed (it is necessary for the developing solution to be non-silicate system and have a pH lower than that of conventional developing solution).

Fifth, to contain a chelating agent capable of removing divalent metal, e.g., Ca ion contained in water, which metal is a factor of rendering development processing unstable.

Of these, the first and the second requirements also relate to the characteristics of the component of the light-sensitive layer. In particular, there are no restrictions as to a light-sensitive layer of the photopolymerizable lithographic printing plate precursor. It has so far become apparent that it is of importance for the photopolymerizable light-sensitive layer to have an acid value lower than that of a conventional layer in the point of obtaining synergistic effects with the developing solution of the invention.

[Acid Value of Light-Sensitive Layer]

The acid value of the light-sensitive layer means an equivalent amount of acid of 9 or less in pKa contained per g of the light-sensitive layer provided on the support of the light-sensitive lithographic printing plate precursor (not including an overcoat layer provided on the light-sensitive layer, e.g., an oxygen barrier layer). It can be experimentally determined by directly titrating the light-sensitive layer with a sodium hydroxide aqueous solution, and also can be determined by calculation based on the content of the compound having an acid group of 9 or less in pKa present in the composition for the photopolymerizable layer.

As a specific method for changing the acid value of the light-sensitive layer, it may be considered to change the proportion of the crosslinking agent monomer/binder polymer having an acid group (linear polymer) or to use a low-acid-value binder polymer having a less amount of acid group.

The low-acid-value binder polymer has an acid value of preferably 1.5 meq/g or less, more preferably 1.2 meq/g or less.

The light-sensitive layer of the invention has an acid value of preferably 1.0 meq/g or less. It is more advantageous to apply the developing solution to a lithographic printing plate precursor having a light-sensitive layer of from 0.20 to 0.60 meq/g in acid value. In view of image-forming performance, the light-sensitive layer has an acid value of preferably from 0.30 to 0.50 meq/g.

The special developing solution is characterized in that it has less permeating property in comparison with conventional developing solutions and dissolved the light-sensitive layer from the surface without destroying the interior of the photo-cured area and the support surface. In the case of using such a developing solution, it never occurs that the image area is completely delaminated from the support as a result of permeation of the developing solution into the cured area and, therefore, development can be performed depending on the curing degree of the light-sensitive layer. A portion cured with a slight amount of light such as flare light has a low curing degree, whereas an image area exposed to laser light has a sufficiently high curing degree. Thus, in the case of using the developing solution, the non-image area slightly cured by the flare light can completely be developed and removed, whereas the laser light-exposed area can firmly form the image area without being developed.

Also, in the case of undercoating a dye on the support, the special developing solution has such an excellent dye-dissolving or dye-dispersing ability that remaining color in the non-image area can be reduced and plate-inspecting property can be improved, thus being preferred in this point, too. Examples of the special developing solution are disclosed in JP-A-2002-202616, and DV-2 developing solution manufactured by Fuji Photo Film Co., Ltd. is a commercially available one. That is, an extremely contrasty image can be formed.

Regarding use of the image-recording material using the photo-polymerizable composition of the invention, it can find applications, with no restrictions, to uses known as uses of photo-curable resins in addition to the lithographic printing plate precursor for scanning exposure.

For example, a highly sensitive material for stereolithography can be obtained by applying to a liquid photo-polymerizable composition also containing, if desired, a cation-polymerizable compound. Also, it can be a material for hologram utilizing change in refractive index with the progress of photopolymerization. It can also be applied to various transfer materials (e.g., peelable light-sensitive material and toner-developable light-sensitive material) utilizing change in surface adhesion. It can also be applied to photo-curable microcapsules. It can also find application to production of an electronic material, e.g., photoresist, and a photo-curable resin material, e.g., ink, paint or adhesive.

The invention is described in more detail below by reference to the examples which, however, are not construed to limit the invention.

<Synthesis Example of Compound Represented by Formula (I)>

5.0 g of 1-hydroxybenzotriazole was dissolved in 4.5 g of triethylamine and 50 ml of DMAc and, under stirring with ice-cooling, 5.2 g of benzoyl chloride was dropwise added thereto for 10 minutes through a dropping funnel. Subsequently, the reaction mixture was stirred for 1 hour at room temperature, and crystals precipitated were removed by filtration. Subsequently, the filtrate was added to 500 ml of water to crystallize. The crystals were collected by filtration, and dried for 30 minutes in a vacuum pump to obtain 6.4 g of Compound A shown below.

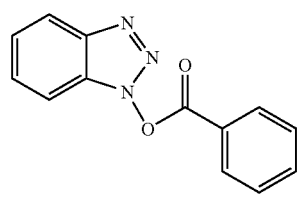

A

By using the following acid halide compound in place of benzoyl chloride,

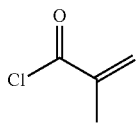

Compound B shown below was obtained.

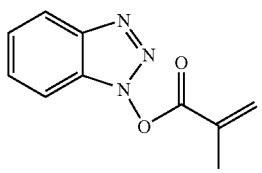
B 5.0 g of 1-benzotriazole-1-methanol was dissolved in 4.1 g of triethylamine and 50 ml of DMAc and, under stirring with ice-cooling, 4.7 g of benzoyl chloride was dropwise added thereto for 10 minutes through a dropping funnel. Subsequently, the reaction mixture was stirred for 1 hour at room temperature, and crystals precipitated were removed by filtration. Subsequently, the filtrate was added to 500 ml of water to crystallize. The crystals were collected by filtration, and dried for 30 minutes in a vacuum pump to obtain 7.4 g Compound C shown below.

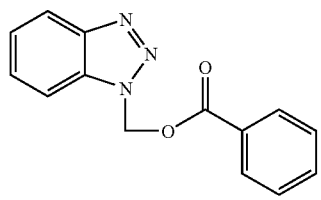
C

By using the following acid halide compounds in place of benzoyl chloride, the corresponding Compounds D to F were obtained, respectively.

D
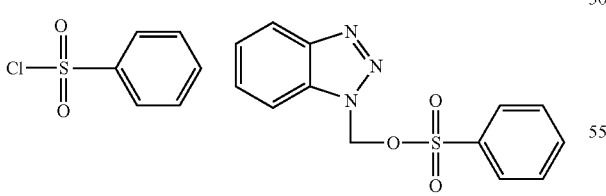

E
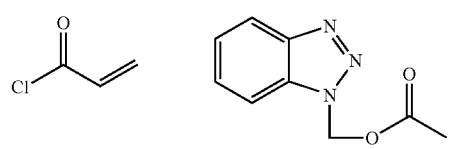

F
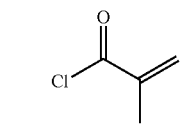 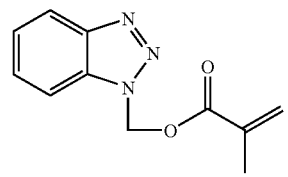

5.0 g of benzotriazole was dissolved in 5.1 g of triethylamine and 50 ml of DMAc and, under stirring with ice-cooling, 5.9 g of benzoyl chloride was dropwise added thereto for 10 minutes through a dropping funnel. Subsequently, the reaction mixture was stirred for 1 hour at room temperature, and crystals precipitated were removed by filtration. Subsequently, the filtrate was added to 500 ml of water to crystallize. The crystals were collected by filtration, and dried for 30 minutes in a vacuum pump to obtain 7.7 g of Compound G.

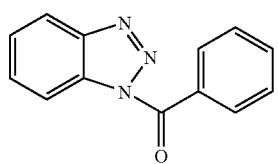
G

By using the following acid halide compounds in place of benzoyl chloride, the corresponding Compounds H to J were obtained, respectively.

H
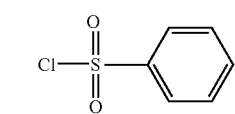 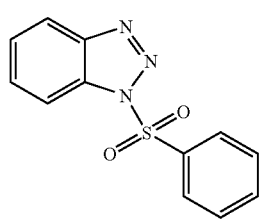

I
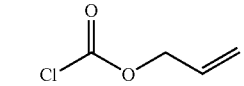 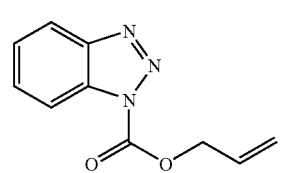

J
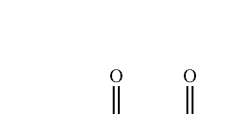 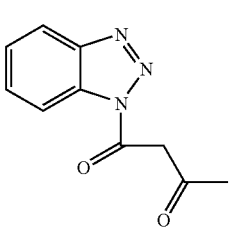

[Production Example of Support]

(Support 1: Production of Anodized Aluminum Support)

A 0.30-mm thick, 1S aluminum plate was grained at the surface thereof using a No.8 nylon brush and an aqueous suspension containing 800-mesh pumice stone, and then thoroughly washed with water. The plate was immersed in a 10% aqueous solution of sodium hydroxide at 70° C. for 60 seconds to etch, followed by washing with running water, neutralizing with 20% $HNO_3$, and then washing with water. The plate was then subjected to the electrolytic surface roughening treatment in a 1% nitric acid aqueous solution under the condition of VA=12.7 V at an anodic time electricity of 300 $C/dm^2$ using a current having an alternating sine wave form. The surface roughness was measured and found to be 0.45 μm (in terms of Ra). Subsequently, the plate was immersed in a 30% $H_2SO_4$ aqueous solution to desmut at 55° C. for 2 minutes. Then, the plate was anodized in a 20% $H_2SO_4$ aqueous solution of 33° C. at an electric current of 5 $A/dm^2$ for 50 seconds with disposing a cathode to the grained surface to form an anodic oxide film of 2.7 $g/m^2$ in thickness. This plate was referred to as Support 1.

(Production of Support 2)

Liquid composition 1 for undercoating shown below was coated on Support 1 so as to have a P amount of about 0.05 $g/M^2$ for surface treatment, followed by drying at 100° C. for 1 minute. The resulting plate was referred to as Support 2.

<Liquid Composition 1 for Undercoating>

| | |
|---|---|
| Phenylphosphonic acid | 2 parts by weight |
| Methanol | 800 parts by weight |
| Water | 50 parts by weight |

(Production of Support 3)

Liquid composition 2 for undercoating shown below was coated on Support 1 so as to have a Si amount of about 0.001 $g/m^2$ for surface treatment, followed by drying at 100° C. for 1 minute. The resulting plate was referred to as Support 3.

<Liquid Composition 2 for Undercoating>

The following components were mixed and stirred and, after 5 minutes, the mixture generated heat. After reacting for 60 minutes, the contents were transferred to a different vessel, and 30,000 parts of methanol was added thereto to prepare Liquid composition 2.

| | |
|---|---|
| Phosmer PE shown below | 20 parts by weight |
| Methanol | 130 parts by weight |
| Water | 20 parts by weight |
| p-Toluenesulfonic acid | 5 parts by weight |

| | |
|---|---|
| Tetraethoxysilane | 50 parts by weight |
| 3-Methacryloxypropyl-triethoxysilane | 50 parts by weight |
| Phosmer PE | |

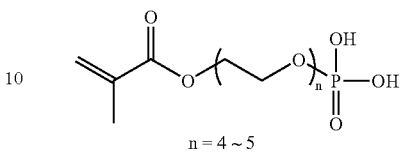

n = 4 ~ 5

(Produced by Uni-Chemical Co., Ltd.)

(Production of Support 4)

A solution prepared by dissolving methyl methacrylate/ethyl acrylate/sodium 2-acrylamido-2-methylpropane-sulfonate copolymer (60/25/15 in molar ratio; molecular weight Mn=30,000) in water/methanol (5 g/95 g) was coated on Support 1 so as to have a coating amount of 3 $mg/m^2$, followed by drying at 80° C. for 30 seconds. The resulting plate was referred to as Support 4.

[Production Example of Lithographic Printing Plate Precursor]

On each of Supports 1 to 4 was coated the photopolymerizable composition of the following formulation so as to have a dry amount shown in Table 1, followed by drying at 95° C. to form a light-sensitive layer.

(Coating solution for light-sensitive layer (photopolymerizable composition): described in detail in Table 1)

| | |
|---|---|
| Addition-polymerizable compound (A) | shown in Table 1 |
| Binder polymer (B) | shown in Table 1 |
| Sensitizing dye (D) | 0.10 parts by weight |
| Initiator (I) | 0.05 parts by weight |
| Additive (H) | 0.25 parts by weight |
| Fluorine-containing surfactant (Megafac F-177; made by Dainippon Ink & Chemicals, Inc.) | 0.02 parts by weight |
| Thermal polymerization inhibitor (N-nitrosohydroxylamine aluminum salt) | 0.03 parts by weight |
| Dispersion of ε-type copper phthalocyanine | 0.2 parts by weight |
| Methyl ethyl ketone | 16.0 parts by weight |
| Propylene glycol monomethyl ether | 16.0 parts by weight |
| one of Benzotriazole compounds (A) to (J) of the invention | 0.10 parts by weight |

TABLE 1

| | | | <Light-sensitive layer> | | | | |
|---|---|---|---|---|---|---|---|
| Light-sensitive layer | Support | Coating Amount $(g/m^2)$ | Addition-polymerizable Compound A (parts by weight) | Binder Polymer B (parts by weight) | Sensitizing Dye D | Initiator I | Additive H |
| 1 | 1 | 1.4 | A1 0.8 | B1 0.9 | D1 | I1 | H1 |
| 2 | 3 | 1.8 | A2 0.9 | B3 0.7 | D1 | I1 | H1 |

TABLE 1-continued

<Light-sensitive layer>

| Light-sensitive layer | Support | Coating Amount (g/m²) | Addition-polymerizable Compound A (parts by weight) | Binder Polymer B (parts by weight) | Sensitizing Dye D | Initiator I | Additive H |
|---|---|---|---|---|---|---|---|
| 3 | 4 | 2 | A1 1.2 | B1 1 | D1 | I1 | H1 |
| 4 | 2 | 0.9 | A3 0.7 | B2 1.1 | D2 | I1 | H2 |
| 5 | 2 | 1.5 | A1 1.2 | B1 0.7 | D3 | I1 | H1 |

Addition-polymerizable compound (A), binder polymer (B), sensitizing dye (D), initiator (I) and additive (H) used in the coating solutions for light-sensitive layer are shown below.

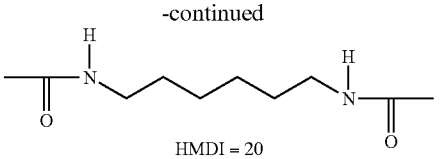

A1

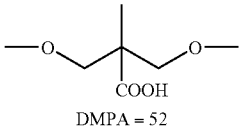

A2

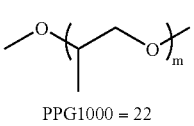

A3

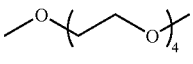

B1

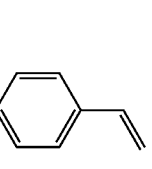

B2

B3

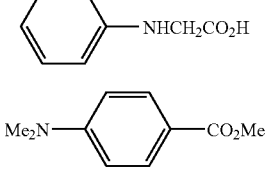

MDI = 80

-continued

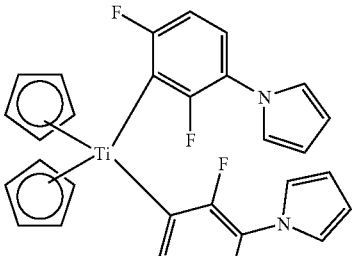

HMDI = 20

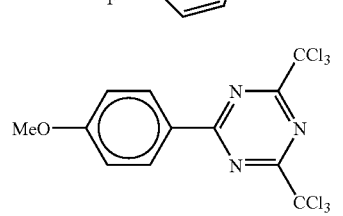

DMPA = 52

PPG1000 = 22

TEG = 26

H1

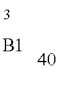

H2

H3

I1

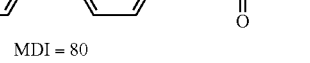

I2

-continued

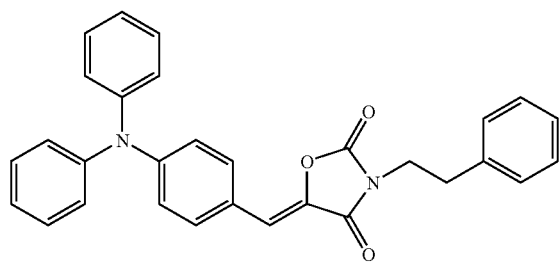
D1

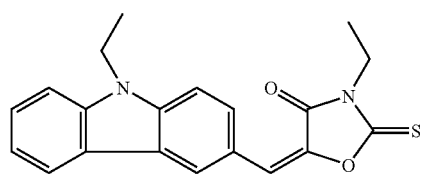
D2

[Coating of Protective Layer]

A 3% by weight aqueous solution of polyvinyl alcohol (saponification degree: 98 mol %; polymerization degree: 550) was coated on each of the light-sensitive layers so as to have a dry coating amount of 2 g/m², followed by drying at 100° C. for 2 minutes.

EXAMPLES 1 TO 50 AND COMPARATIVE EXAMPLES 1 TO 5

(Exposure)

Exposure 1 (Light-Sensitive Layers 1 to 4)

Each of lithographic printing plate precursors respectively having light-sensitive layers 1 to 4 was scan-exposed to a solid image and a 1 to 99% halftone dot image (1% intervals) under the conditions of 50 μJ/cm² in exposure amount, 4,000 dpi and 175 lines/inch using a Violet LD of 405 nm in wavelength (Violet Boxer, manufactured by FFEI).

Exposure 2 (Light-Sensitive Layer 5)

A lithographic printing plate precursor having light-sensitive layer 5 was scan-exposed to a solid image and a 1 to 99% halftone dot image (1% intervals) under the conditions of 100 μJ/cm² in exposure amount, 4,000 dpi and 175 lines/inch using an FD•YAG laser (Plate Jet 4, manufactured by CSI; 532 nm).

(Development)

Standard treatment was conducted in an automatic developing machine (LP-850P2, manufactured by Fuji Photo Film Co., Ltd.) containing Developer 1 (or 2) and a finishing gum solution FP-2W (manufactured by Fuji Photo Film Co., Ltd.). Preheating conditions was 100° C. at the temperature reaching the plate surface. The temperature of developing solution was 30° C. and the time of immersing in the developing solution was about 15 seconds.

Developing solutions 1 and 2 had the following formulations and had pH of 11.5 (Developing solution 1) and 12.3 (Developing solution 2) at 25° C., and electric conductivity of 5 mS/cm (Developing solution 1) and 17 mS/cm (Developing solution 2), respectively.

| (Formulation of Developing solution 1) | |
| --- | --- |
| Potassium hydroxide | 0.15 g |
| Polyoxyethylene phenyl ether (n = 13) | 5.0 g |
| Chelest 400 (chelating agent) | 0.1 g |
| Water | 94.75 g |
| (Formulation of Developing solution 2) | |
| 1K-Potassium silicate | 2.5 g |
| Potassium hydroxide | 0.15 g |
| Polyoxyethylene phenyl ether (n = 13) | 5.0 g |
| Chelest 400 (chelating agent) | 0.1 g |
| Water | 92.25 g |

[Evaluation of Printing Plate Precursor]

Sensitivity and storage stability of the thus obtained lithographic printing plate precursors were evaluated in the following manner. Results are tabulated in Table 2.

(Evaluation of Sensitivity)

Each of the printing plate precursors was exposed under the conditions shown in Table 2 and, immediately thereafter, was developed under the conditions shown in Table 2 to form an image. The area (in %) of 50% halftone dot was measured by means of a halftone dot area-measuring device (Gretag-Macbeth).

(Evaluation of Storage Stability)

The measurement of the halftone dot area was conducted in the same manner as in the evaluation of sensitivity except for using the lithographic printing plate precursors after leaf for 4 days at 60° C. in a state of being tightly closed by aluminum kraft paper together with an interleaf. Next, difference between the halftone dot area measured after being left for 4 days at 60° C. and the halftone dot area measured before being left for 4 days at 60° C. was calculated to determine halftone dot variation (Δ %). A smaller absolute numerical value shows that the sample is less affected by the accelerated aging, that is, that the sample has a higher storage stability. Results obtained are shown in Table 2.

TABLE 2

| Example | Light-sensitive layer | Specific compound | Exposure condition | Developer | Sensitivity (%) | Storage stability (%) |
| --- | --- | --- | --- | --- | --- | --- |
| Example 1 | 1 | A | 1 | 1 | 63 | 3.5 |
| Example 2 | 1 | B | 1 | 1 | 63 | 3.5 |
| Example 3 | 1 | C | 1 | 1 | 62 | 2.0 |
| Example 4 | 1 | D | 1 | 1 | 62 | 2.0 |
| Example 5 | 1 | E | 1 | 1 | 62 | 2.0 |
| Example 6 | 1 | F | 1 | 1 | 62 | 2.0 |
| Example 7 | 1 | G | 1 | 1 | 59 | 3.5 |
| Example 8 | 1 | H | 1 | 1 | 60 | 3.5 |

TABLE 2-continued

| Example | Light-sensitive layer | Specific compound | Exposure condition | Developer | Sensitivity (%) | Storage stability (%) |
|---|---|---|---|---|---|---|
| Example 9 | 1 | I | 1 | 1 | 60 | 3.5 |
| Example 10 | 1 | J | 1 | 1 | 60 | 3.5 |
| Comparative Example 1 | 1 | none | 1 | 1 | 59 | 5.0 |
| Example 11 | 2 | A | 1 | 2 | 60 | 3.5 |
| Example 12 | 2 | B | 1 | 2 | 60 | 3.5 |
| Example 13 | 2 | C | 1 | 2 | 59 | 2.0 |
| Example 14 | 2 | D | 1 | 2 | 58 | 2.0 |
| Example 15 | 2 | E | 1 | 2 | 58 | 2.5 |
| Example 16 | 2 | F | 1 | 2 | 59 | 2.0 |
| Example 17 | 2 | G | 1 | 2 | 57 | 4.0 |
| Example 18 | 2 | H | 1 | 2 | 57 | 4.0 |
| Example 19 | 2 | I | 1 | 2 | 57 | 4.0 |
| Example 20 | 2 | J | 1 | 2 | 57 | 4.0 |
| Comparative Example 2 | 2 | none | 1 | 2 | 56 | 5.5 |
| Example 21 | 3 | A | 1 | 2 | 61 | 3.5 |
| Example 22 | 3 | B | 1 | 2 | 61 | 3.5 |
| Example 23 | 3 | C | 1 | 2 | 60 | 2.0 |
| Example 24 | 3 | D | 1 | 2 | 60 | 2.5 |
| Example 25 | 3 | E | 1 | 2 | 60 | 2.0 |
| Example 26 | 3 | F | 1 | 2 | 60 | 2.0 |
| Example 27 | 3 | G | 1 | 2 | 57 | 3.5 |
| Example 28 | 3 | H | 1 | 2 | 57 | 3.5 |
| Example 29 | 3 | I | 1 | 2 | 58 | 3.5 |
| Example 30 | 3 | J | 1 | 2 | 58 | 3.5 |
| Comparative Example 3 | 3 | none | 1 | 2 | 56 | 5.0 |
| Example 31 | 4 | A | 1 | 2 | 64 | 3.5 |
| Example 32 | 4 | B | 1 | 2 | 64 | 3.5 |
| Example 33 | 4 | C | 1 | 2 | 63 | 3.0 |
| Example 34 | 4 | D | 1 | 2 | 63 | 2.5 |
| Example 35 | 4 | E | 1 | 2 | 63 | 2.0 |
| Example 36 | 4 | F | 1 | 2 | 63 | 2.0 |
| Example 37 | 4 | G | 1 | 2 | 61 | 3.0 |
| Example 38 | 4 | H | 1 | 2 | 62 | 3.5 |
| Example 39 | 4 | I | 1 | 2 | 62 | 3.5 |
| Example 40 | 4 | J | 1 | 2 | 61 | 3.5 |
| Comparative Example 4 | 4 | none | 1 | 2 | 61 | 6.0 |
| Example 41 | 5 | A | 2 | 1 | 54 | 3.5 |
| Example 42 | 5 | B | 2 | 1 | 54 | 3.5 |
| Example 43 | 5 | C | 2 | 1 | 53 | 2.0 |
| Example 44 | 5 | D | 2 | 1 | 53 | 2.5 |
| Example 45 | 5 | E | 2 | 1 | 52 | 2.0 |
| Example 46 | 5 | F | 2 | 1 | 53 | 2.0 |
| Example 47 | 5 | G | 2 | 1 | 52 | 2.5 |
| Example 48 | 5 | H | 2 | 1 | 51 | 3.0 |
| Example 49 | 5 | I | 2 | 1 | 51 | 3.5 |
| Example 50 | 5 | J | 2 | 1 | 51 | 3.5 |
| Comparative Example 5 | 5 | none | 2 | 1 | 50 | 5.0 |

As is apparent from Table 2, the lithographic printing plate precursors of the examples wherein the compounds represented by formula (I), which are the characteristic aspect of the invention, are added show both favorable sensitivity and favorable storage stability, and thus satisfactory results are obtained. On the contrary, the lithographic printing plate precursors of the comparative examples were unsatisfactory in the storage stability.

<Synthesis Example of Sulfone Compound>

Hydroxymethylphenylsulfone (Compound X) can be synthesized, for example, by the process described in H. Bredereck and E. Bader, *Chem. Ber.*, (1954) 129.

10.0 g of hydroxymethylphenylsulfone (Compound X) shown below was dissolved in 7.1 g of triethylamine and 100 ml of DMAc and, under stirring with ice-cooling, 8.2 g of benzoyl chloride was dropwise added thereto for 10 minutes through a dropping funnel. Subsequently, the reaction mixture was stirred for 1 hour at room temperature, and crystals precipitated were removed by filtration. Subsequently, the filtrate was added to 500 ml of water to crystallize. The crystals were collected by filtration, and dried for 30 minutes in a vacuum pump to obtain 13.4 g of Compound SA. Compound X

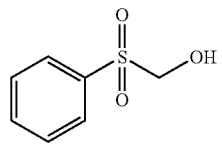

Compound X

By using the acid halide compound or the isocyanate compound shown below in place of benzoyl chloride in the process for synthesizing Compound SA, Compounds SB and SC were obtained.

Acid halide compound Isocyanate compound

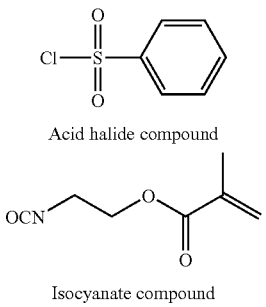

Acid halide compound

Isocyanate compound

By using hydroxyethylphenylsulfone in place of the hydroxymethylphenylsulfone in the process for synthesizing Compound SA, Compound SD was obtained.

10.0 g of 4,4'-diphenylsuofone and 11.0 g of potassium carbonate were added to 100 ml of DMAc and, after adding thereto 14.2 g of methyl iodide, the mixture was heated and stirred at 80° C. for 5 hours. Subsequently, the reaction solution was added to 500 ml of water to crystallize. The crystals were collected by filtration, recrystallized and dried for 30 minutes in a vacuum pump to obtain 11.4 g of Compound SF.

10.0 g of 4,4'-diphenylsulfone was dissolved in 8.9 g of triethylamine and 100 ml of DMAc and, under stirring with ice-cooling, 8.4 g of methacrylic acid chloride was dropwise added thereto for 10 minutes through a dropping funnel. Subsequently, the reaction mixture was stirred for 1 hour at room temperature, and crystals precipitated were removed by filtration. Subsequently, the filtrate was added to 500 ml of water to crystallize. The crystals were collected by filtration, and dried for 30 minutes in a vacuum pump to obtain 14.4 g of Compound SG.

By using the isocyanate compound shown above in place of methacrylic acid chloride in the process for synthesizing Compound SG, Compound SH was obtained.

Compound SJ was obtained by hydrolyzing methylphenylsulfonyl butyrate with KOH in a MeOH/water solvent.

Structures of compounds SA to SD, SF to SH and SJ and commercially available Compounds SE and SI (both produced by Aldrich Co.) are shown below.

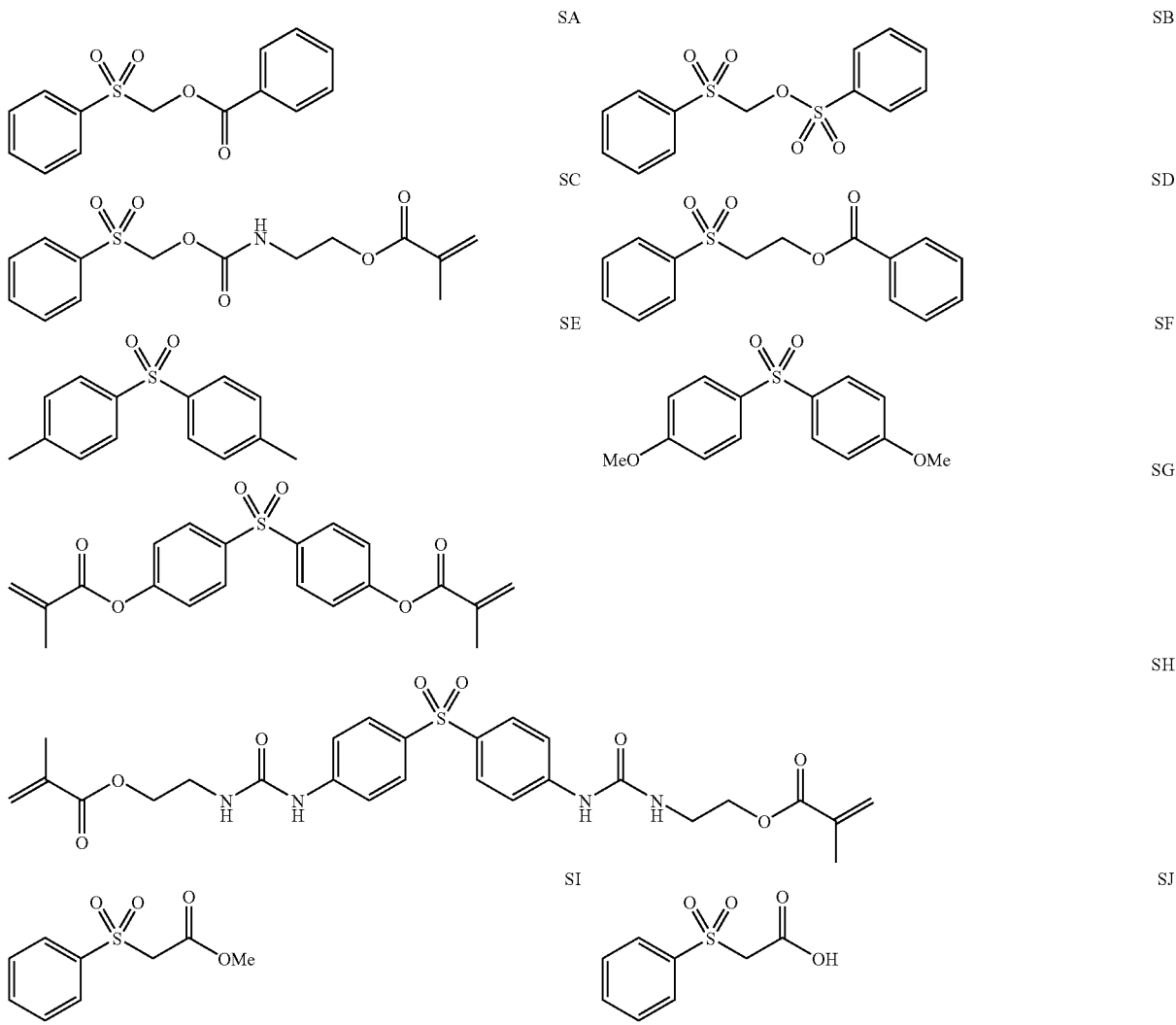

[Production Example of Lithographic Printing Plate Precursor]

On each of Supports 1 to 4 described above was coated the photopolymerizable composition of the following formulation so as to have a dry coating amount shown in Table 3, followed by drying at 95° C. to form a photopolymerizable light-sensitive layer.

(Coating Solution for Light-Sensitive Layer (Photo-Polymerizable Composition): Described in Detail in the following Table 3)

Addition-polymerizable compound (A) shown in Table 3

| | |
|---|---|
| Binder polymer (B) | shown in Table 3 |
| Sensitizing dye (D) | 0.10 parts by weight |
| Initiator (I) | 0.05 parts by weight |
| Additive (H) | 0.25 parts by weight |
| Fluorine-containing surfactant (Megafac F-177; made by Dainippon Ink & Chemicals, Inc.) | 0.02 parts by weight |
| Thermal polymerizatiori inhibitor (N-nitrosohydroxylamine aluminum salt) | 0.03 parts by weight |
| Dispersion of ε-type copper phthalocyanine | 0.2 parts by weight |
| Methyl ethyl ketone | 16.0 parts by weight |
| Propylene glycol monomethyl ether | 16.0 parts by weight |
| Specific sulfone compound of the invention | 0.10 parts by weight |

[Coating of Protective Layer]

A 3% by weight aqueous solution of polyvinyl alcohol (saponification degree: 98 mol %; polymerization degree: 550) was coated on each of the light-sensitive layers so as to have a dry coating amount of 2 g/m², followed by drying at 100° C. for 2 minutes.

EXAMPLES 51 TO 100 AND COMPARATIVE EXAMPLES 6 TO 10

(Exposure)

Exposure 1 (Light-Sensitive Layers 6 to 9)

Each of lithographic printing plate precursors respectively having light-sensitive layers 6 to 9 was scan-exposed to a solid image and a 1 to 99% halftone dot image (1% intervals) under the conditions of 50 µJ/cm2 in exposure amount, 4,000 dpi and 175 lines/inch using a Violet LD of 405 nm in wavelength (Violet Boxer, manufactured by FFEL).

Exposure 2 (Light-Sensitive Layer 10)

A lithographic printing plate precursor having light-sensitive layer 10 was scan-exposed to a solid image and a 1 to 99% halftone dot image (1% intervals) under the conditions of 100 µJ/cm² in exposure amount, 4,000 dpi and 175 lines/inch using an FD•YAG laser (Plate Jet, 4 manufactured. by CSI; 532 nm).

(Development)

Standard treatment was conducted in an automatic developing machine (LP-850P2, manufactured by Fuji Photo Film Co., Ltd.) containing Developer 1 (or 2) and a finishing gum solution FP-2W (manufactured by Fuji Photo Film Co., Ltd.). Preheating conditions was 100° C. at the temperature reaching the plate surface. The temperature of developing solution was 30° C. and the time of immersing in the developing solution was about 15 seconds.

Developing solutions 1 and 2 had the following formulations and had pH of 11.5 (Developing solution 1) and 12.3 (Developing solution 2) at 25° C., and electric conductivity of 5 mS/cm (Developing solution 1) and 17 mS/cm (Developing solution 2), respectively.

TABLE 3

<Light-sensitive layer>

| Light-sensitive layer | Support | Coating Amount (g/m²) | Addition-polymerizable Compound A (parts by weight) | Binder Polymer B (parts by weight) | Sensitizing Dye D | Initiator I | Additive H |
|---|---|---|---|---|---|---|---|
| 6 | 1 | 1.4 | A1 0.8 | B1 0.9 | D1 | I1 | H1 |
| 7 | 3 | 1.8 | A2 0.9 | B3 0.7 | D1 | I1 | H1 |
| 8 | 4 | 2 | A1 1.2 | B1 1 | D1 | I1 | H1 |
| 9 | 2 | 0.9 | A3 0.7 | B2 1.1 | D2 | I1 | H2 |
| 10 | 2 | 1.5 | A1 1.2 | B1 0.7 | D3 | I1 | H1 |

Addition-polymerizable compound (A), binder polymer (B), sensitizing dye (D), initiator (I) and additive (H) are same as those shown above respectively.

| (Formulation of Developing solution 1) | |
|---|---|
| Potassium hydroxide | 0.15 g |
| Polyoxyethylene phenyl ether (n = 13) | 5.0 g |
| Chelest 400 (chelating agent) | 0.1 g |
| Water | 94.75 g |
| (Formulation of Developing solution 2) | |
| 1K-Potassium silicate | 2.5 g |
| Potassium hydroxide | 0.15 g |
| Polyoxyethylene phenyl ether (n = 13) | 5.0 g |
| Chelest 400 (chelating agent) | 0.1 g |
| Water | 92.25 g |

[Evaluation of Printing Plate Precursor]

Sensitivity and storage stability of the thus obtained lithographic printing plate precursors were evaluated in the same manner as in Examples 1 to 50. Results obtained are shown in Table 4.

TABLE 4

| Example | Light-sensitive layer | Specific compound | Exposure condition | Developer | Sensitivity (%) | Storage stability (%) |
|---|---|---|---|---|---|---|
| Example 51 | 6 | SA | 1 | 1 | 62 | 2.0 |
| Example 52 | 6 | SB | 1 | 1 | 62 | 2.0 |
| Example 53 | 6 | SC | 1 | 1 | 63 | 2.0 |
| Example 54 | 6 | SD | 1 | 1 | 60 | 3.0 |
| Example 55 | 6 | SE | 1 | 1 | 61 | 2.5 |
| Example 56 | 6 | SF | 1 | 1 | 62 | 2.5 |
| Example 57 | 6 | SG | 1 | 1 | 62 | 3.0 |
| Example 58 | 6 | SH | 1 | 1 | 62 | 3.0 |
| Example 59 | 6 | SI | 1 | 1 | 60 | 2.5 |
| Example 60 | 6 | SJ | 1 | 1 | 60 | 2.5 |
| Comparative Example 6 | 6 | none | 1 | 1 | 59 | 5.0 |
| Example 61 | 7 | SA | 1 | 2 | 61 | 2.5 |
| Example 62 | 7 | SB | 1 | 2 | 61 | 2.5 |
| Example 63 | 7 | SC | 1 | 2 | 60 | 2.5 |
| Example 64 | 7 | SD | 1 | 2 | 57 | 3.5 |
| Example 65 | 7 | SE | 1 | 2 | 58 | 3.0 |
| Example 66 | 7 | SF | 1 | 2 | 59 | 3.0 |
| Example 67 | 7 | SG | 1 | 2 | 59 | 3.5 |
| Example 68 | 7 | SH | 1 | 2 | 59 | 3.5 |
| Example 69 | 7 | SI | 1 | 2 | 57 | 3.0 |
| Example 70 | 7 | SJ | 1 | 2 | 57 | 3.0 |
| Comparative Example 7 | 7 | none | 1 | 2 | 56 | 5.5 |
| Example 71 | 8 | SA | 1 | 2 | 61 | 2.0 |
| Example 72 | 8 | SB | 1 | 2 | 61 | 2.0 |
| Example 73 | 8 | SC | 1 | 2 | 60 | 2.0 |
| Example 74 | 8 | SD | 1 | 2 | 57 | 3.0 |
| Example 75 | 8 | SE | 1 | 2 | 58 | 2.5 |
| Example 76 | 8 | SF | 1 | 2 | 59 | 2.5 |
| Example 77 | 8 | SG | 1 | 2 | 59 | 3.0 |
| Example 78 | 8 | SH | 1 | 2 | 56 | 3.0 |
| Example 79 | 8 | SI | 1 | 2 | 57 | 2.5 |
| Example 80 | 8 | SJ | 1 | 2 | 57 | 2.5 |
| Comparative Example 8 | 8 | none | 1 | 2 | 56 | 5.0 |
| Example 81 | 9 | SA | 1 | 2 | 63 | 3.0 |
| Example 82 | 9 | SB | 1 | 2 | 63 | 3.0 |
| Example 83 | 9 | SC | 1 | 2 | 64 | 3.0 |
| Example 84 | 9 | SD | 1 | 2 | 61 | 4.0 |
| Example 85 | 9 | SE | 1 | 2 | 62 | 3.5 |
| Example 86 | 9 | SF | 1 | 2 | 63 | 3.5 |
| Example 88 | 9 | SH | 1 | 2 | 63 | 4.0 |
| Example 89 | 9 | SI | 1 | 2 | 61 | 3.5 |
| Example 90 | 9 | SJ | 1 | 2 | 61 | 3.5 |
| Comparative Example 9 | 9 | none | 1 | 2 | 61 | 6.0 |
| Example 91 | 10 | SA | 2 | 1 | 53 | 2.0 |
| Example 92 | 10 | SB | 2 | 1 | 53 | 2.0 |
| Example 93 | 10 | SC | 2 | 1 | 54 | 2.0 |
| Example 94 | 10 | SD | 2 | 1 | 51 | 3.0 |
| Example 95 | 10 | SE | 2 | 1 | 52 | 2.5 |
| Example 96 | 10 | SF | 2 | 1 | 53 | 2.5 |
| Example 97 | 10 | SG | 2 | 1 | 53 | 3.0 |
| Example 98 | 10 | SH | 2 | 1 | 53 | 3.0 |
| Example 99 | 10 | SI | 2 | 1 | 51 | 2.5 |
| Example 100 | 10 | SJ | 2 | 1 | 51 | 2.5 |
| Comparative Example 10 | 10 | none | 2 | 1 | 50 | 5.0 |

As is apparent from Table 4, the lithographic printing plate precursors of the examples wherein the specific sulfone compounds, which are the characteristic aspect of the invention, are added show both favorable sensitivity and favorable storage stability, and thus satisfactory results are obtained. On the contrary, the lithographic printing plate precursors of the comparative examples were unsatisfactory in the storage stability.

EXAMPLES 101 TO 109

The evaluations of sensitivity and storage stability were conducted in the same manner as in Examples 1, 21, 31, 41, 51, 61, 71, 81 and 91 were performed except for changing Initiator I1 used in the light-sensitive layer of lithographic printing plate precursor to Initiator I2 (Examples 101 to 109). Results of the sensitivity and storage stability obtained are shown in Table 5.

TABLE 5

| Example | Sensitivity (%) | Storage stability (%) |
|---|---|---|
| Example 101 | 62 | 3.5 |
| Example 102 | 60 | 3.5 |
| Example 103 | 63 | 3.5 |
| Example 104 | 53 | 3.5 |
| Example 105 | 61 | 2.5 |

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A polymerizable composition comprising an ethylenic monomer, a photopolymerization initiator and a benzotriazole compound represented by the following formula (II) or (III):

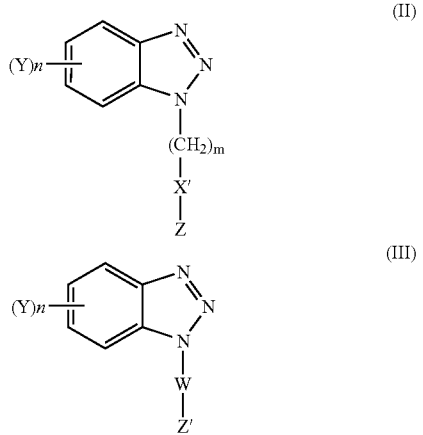

wherein X' represents O, S or NZ', Z and Z' each independently represents a straight-chain, branched-chain or cyclic alkyl group containing from 1 to 20 carbon atoms, a straight-chain, branched-chain or cyclic alkenyl group containing from 2 to 20 carbon atoms, an alkynyl group containing from 2 to 20 carbon atoms, an aryl group containing from 6 to 20 carbon atoms, an acyloxy group containing from 1 to 20 carbon atoms, a carbamoyloxy group containing from 1 to 20 carbon atoms, an alkoxy group containing from 1 to 20 carbon atoms, an aryloxy group containing from 6 to 20 carbon atoms, an alkylsulfonyl group containing from 1 to 20 carbon atoms, an arylsulfonyl group containing from 6 to 20 carbon atoms, an amino group containing from 0 to 20 carbon atoms, an imino group containing from 1 to 20 carbon atoms, a sulfo group, an alkylthio group containing from 1 to 20 carbon atoms, an arylthio group containing from 6 to 20 carbon atoms, a ureido group containing from 1 to 20 carbon atoms, a hetero ring group containing from 2 to 20 carbon atoms, an acyl group containing from 1 to 20 carbon atoms, a halogen atom, a silyl group containing from 2 to 20 carbon atoms, provided that each of the recited groups may further have a substituent, Y represents a straight-chain, branched-chain or cyclic alkyl group containing from 1 to 20 carbon atoms, an alkoxy group containing from 1 to 20 carbon atoms, an aryl group containing from 6 to 20 carbon atoms, a halogen atom, a ureido group containing from 1 to 20 carbon atoms, a hetero ring group containing from 2 to 20 carbon atoms, a cyano group or a hydrogen atom, n represents an integer of from 1 to 4 provided that, when n represents 2 or more, the plural Y's may be the same or different from each other, or may be combined with each other to form a ring structure, W represents —C(=O)— or —S(=O)$_2$—, and m represents an integer of from 0 to 3.

2. The polymerizable composition as claimed in claim 1, wherein the photopolymerization initiator comprises a titanocene compound.

3. A lithographic printing plate precursor comprising a support and a light-sensitive layer containing the polymerizable composition as claimed in claim 1.

4. A process of producing a lithographic printing plate involving a step of exposing a lithographic printing plate precursor comprising a support having provided thereon a light-sensitive layer to a laser light having a wavelength of 450 nm or shorter and a step of treating the exposed precursor with a developing solution, wherein the light-sensitive layer contains the polymerizable composition as claimed in claim 1 and the developing solution has a pH of 13.0 or less.

* * * * *